(12) United States Patent
Yu et al.

(10) Patent No.: US 11,606,080 B2
(45) Date of Patent: Mar. 14, 2023

(54) FILTER DEVICE, RF FRONT-END DEVICE AND WIRELESS COMMUNICATION DEVICE

(71) Applicant: SHENZHEN SUNWAY COMMUNICATION CO., LTD., Guangdong (CN)

(72) Inventors: Chengcheng Yu, Shenzhen (CN); Yanjie Cao, Shenzhen (CN); Wei Wang, Shenzhen (CN)

(73) Assignee: SHENZHEN SUNWAY COMMUNICATION CO., LTD., Shenzhen (CN)

( * ) Notice: Subject to any disclaimer, the term of this patent is extended or adjusted under 35 U.S.C. 154(b) by 47 days.

(21) Appl. No.: 16/941,223

(22) Filed: Jul. 28, 2020

(65) Prior Publication Data

US 2021/0336604 A1 Oct. 28, 2021

Related U.S. Application Data

(63) Continuation of application No. PCT/CN2020/090950, filed on May 19, 2020.

(30) Foreign Application Priority Data

Apr. 26, 2020 (CN) .......................... 202010336621.2

(51) Int. Cl.
*H03H 9/64* (2006.01)
*H03H 9/13* (2006.01)
(Continued)

(52) U.S. Cl.
CPC ........ *H03H 9/6406* (2013.01); *H03H 9/0211* (2013.01); *H03H 9/02228* (2013.01);
(Continued)

(58) Field of Classification Search
CPC .............. H03H 9/6406; H03H 9/0211; H03H 9/02228; H03H 9/02559; H03H 9/131;
(Continued)

(56) References Cited

U.S. PATENT DOCUMENTS

| 5,260,596 A | 11/1993 | Dunn et al. |
| 2012/0218057 A1 | 8/2012 | Burak et al. |

(Continued)

FOREIGN PATENT DOCUMENTS

| CN | 1521945 A | 8/2004 |
| CN | 1523754 A | 8/2004 |

(Continued)

OTHER PUBLICATIONS

Machine English Translation of CN103560763A published on Feb. 5, 2014 (Year: 2014).*

(Continued)

*Primary Examiner* — Rakesh B Patel
*Assistant Examiner* — Jorge L Salazar, Jr.
(74) *Attorney, Agent, or Firm* — Oliff PLC

(57) ABSTRACT

A filter device, an RF front-end device and a wireless communication device are provided. The filter device includes a substrate, a passive device and at least one resonance device, wherein the passive device has a first side and a second side opposite to the first side, the substrate is located on the first side, and the at least one resonance device is located on the second side. The RF filter device formed by integrating the resonance device (such as an SAW or BAW resonance device) and the passive device (such as an IPD) can broaden the pass-band width, has a high out-of-band rejection, and occupies less space in an RF front-end chip.

35 Claims, 11 Drawing Sheets

(51) Int. Cl.
*H03H 9/02* (2006.01)
*H04B 1/00* (2006.01)

(52) U.S. Cl.
CPC ........ *H03H 9/02559* (2013.01); *H03H 9/131* (2013.01); *H03H 9/132* (2013.01); *H04B 1/0057* (2013.01); *H04B 1/0078* (2013.01)

(58) Field of Classification Search
CPC ...... H03H 9/132; H03H 9/0561; H03H 9/542; H03H 9/564; H03H 9/568; H04B 1/0057; H04B 1/0078
USPC .......................... 333/133, 187, 188, 193–196
See application file for complete search history.

(56) References Cited

U.S. PATENT DOCUMENTS

| | | |
|---|---|---|
| 2017/0285695 A1 | 10/2017 | Nair et al. |
| 2018/0013397 A1 | 1/2018 | Lim et al. |
| 2019/0238114 A1* | 8/2019 | Kishimoto ......... H03H 9/02653 |
| 2019/0363694 A1 | 11/2019 | Song et al. |

FOREIGN PATENT DOCUMENTS

| | | |
|---|---|---|
| CN | 101630946 A | 1/2010 |
| CN | 102290329 A | 12/2011 |
| CN | 103360065 A | 10/2013 |
| CN | 103560763 A | 2/2014 |
| CN | 105703736 A | 6/2016 |
| CN | 107529685 A | 1/2018 |
| CN | 107733395 A | 2/2018 |
| CN | 110073595 A | 7/2019 |
| CN | 110649905 A | 1/2020 |

OTHER PUBLICATIONS

May 7, 2022 Office Action issued in Chinese Patent Application No. 202010336621 2.

Dubois et al., "21.2: Integration of High-Q BAW Resonators and Filters Above IC," 2005 IEEE International Solid-State Circuits Conference, Feb. 9, 2005, pp. 392-393 and 606.

Sep. 29, 2021 Office Action issued in Chinese Patent Application No. 202010336621.2.

Jan. 14, 2021 International Search Report issued in International Patent Application No. PCT/CN2020/090950.

* cited by examiner

FILTER DEVICE, RF FRONT-END DEVICE AND WIRELESS COMMUNICATION DEVICE

This is a Continuation of International Application No. PCT/CN2020/090950 filed May 19, 2020, which claims the benefit of Chinese Application No. 202010336621.2 filed Apr. 26, 2020. The disclosure of the prior applications is hereby incorporated by reference herein in its entirety.

TECHNICAL FIELD

The invention relates to the technical field of semiconductors, in particular to a filter device, an RF front-end device and a wireless communication device.

DESCRIPTION OF RELATED ART

The radio frequency (RF) front-end chip of wireless communication equipment includes a power amplifier, an antenna switch, an RF filter, a multiplexer, a low-noise amplifier, and the like, wherein the RF filter is a surface acoustic wave (SAW) filter, a bulk acoustic wave (BAW) filter, a micro-electro-mechanical system (MEMS) filter, an integrated passive devices (IPD) filter, or the like.

SAW resonators and BAW resonators have a high quality factor value (Q value) and are used to manufacture RF filters with a low insertion loss and a high-out-of-band rejection. Wherein, Q value refers to the quality factor value of the resonators and is defined as a value obtained by dividing the center frequency by 3 dB bandwidth of the resonators. The filters manufactured from the SAW resonators and the BAW resonators have a limited pass-band width due to the restrictions of the electromechanical coupling coefficient of piezoelectric materials. IPDs have a broader pass-band width than the SAW filters and the BAW filters.

Filters integrating resonators (such as SAW resonators or BAW resonators) and IPDs can broaden the pass-band width and have a high out-of-band rejection. However, electrical connection of one resonator and one IPD (for example, the ASW or BAW resonator is located in a die, and the IPD is located in another die) will occupy more space in the RF front-end chip and will increase the manufacturing cost. With the rise of 5G, the RF front-end chip may comprise more RF front-end modules each including multiple RF filters, while the size of the chip has to be further decreased, and thus, space optimization has become an important factor taken into consideration when the RF filters are designed.

BRIEF SUMMARY OF THE INVENTION

The issue to be settled by the invention is to provide a filter device, which comprises at least one resonance device (such as a BAW or SAW resonance device) and a passive device (such as an IPD), wherein the at least one resonance device and the passive device are located in a die, so that the pass-band width can be broadened, the out-of-band rejection is high, and the filter device occupies less space in an RF front-end chip. In addition, compared with electrical connection of one resonance device and one passive device, the integration of the resonance device and the passive device in one die can reduce electrical transmission losses, thus improving the filter performance.

To settle the aforesaid issue, an embodiment of the invention provides a filter device, which comprises a substrate, a passive device and at least one resonance device, wherein the passive device has a first side and a second side opposite to the first side, the substrate is located on the first side, and the at least one resonance device is located on the second side. The substrate, the passive device and the at least one resonance device are located in a die. The at least one resonance device is electrically connected to the passive device. It should be noted that the at least one resonance device is electrically connected to the passive device by means of a through hole in the filter device, so that the electrical transmission distance is shortened, and electrical transmission losses are reduced, accordingly.

In some embodiments, the passive device comprises, but is not limited to, at least one of a capacitor, an inductor, a resistor and a through hole. In some embodiments, the passive device includes, but is not limited to, an IPD, wherein the IPD is formed through a semiconductor process.

In some embodiments, the at least one resonance device includes, but is not limited to, at least one of an SAW resonance device and a BAW resonance device.

In some embodiments, the at least one resonance device includes a first resonance device, wherein the first resonance device comprises a first intermediate layer, the first intermediate layer has a third side and a fourth side opposite to the third side, and the passive device is located on the third side. In some embodiments, the first intermediate layer is made of, but not limited to, at least one of the following materials: polymer, insulating dielectric and polysilicon.

In some embodiments, the first intermediate layer further has a first cavity located in the fourth side. In some embodiments, the first resonance device further comprises a first electrode layer, a first piezoelectric layer and a second electrode layer, wherein at least one terminal of the first electrode layer is located in the first cavity; the first piezoelectric layer is located on the fourth side and disposed on the first electrode layer, and the first piezoelectric layer is a flat layer and at least covers the first cavity; the second electrode layer is located on the first piezoelectric layer; and the first electrode layer and the second electrode layer are respectively located on two sides of the piezoelectric layer.

In some embodiments, the first intermediate layer further has a first cavity located in the fourth side. In some embodiments, the first resonance device further comprises a third electrode layer, a second piezoelectric layer and a fourth electrode layer, wherein the third electrode layer is located on the first cavity and covers the first cavity; the second piezoelectric layer is located on the fourth side and disposed over the first intermediate layer and at least covers the third electrode layer; the fourth electrode layer is located on the second piezoelectric layer; and the third electrode layer and the fourth electrode layer are respectively located on two sides of the second piezoelectric layer.

In some embodiments, the first resonance device further comprises a first reflection layer located on the fourth side and disposed on the first intermediate layer, wherein the first reflection layer is of, but not limited to, at least one of the following shapes: trapezoidal shape, arch shape and rectangular shape. In some embodiments, the first reflection layer has a second cavity.

In some embodiments, the first resonance device further comprises a first active layer, which is located on the first intermediate layer and covers the first reflection layer, wherein the first active layer comprises a third piezoelectric layer, and a fifth electrode layer and a sixth electrode layer located on two sides of the third piezoelectric layer. In some embodiments, the fifth electrode layer comprises a first protruding part located on the first reflection layer, wherein the first protruding part is of, but not limited to, at least one of the following shapes: trapezoidal shape, arch shape and rectangular shape. In some embodiments, the third piezoelectric layer comprises a second protruding part located over the first protruding part, wherein the second protruding part is of, but not limited to, at least one of the following shapes: trapezoidal shape, arch shape and rectangular shape.

In some embodiments, the first intermediate layer further comprises first sub-reflection layers and second sub-reflection layers, wherein the first sub-reflection layers and the second sub-reflection layers are arranged alternately and are made of different materials. In some embodiments, the thickness of the first sub-reflection layers is different from that of the second sub-reflection layers. In some embodiments, the first intermediate layer further comprises a Bragg reflector.

In some embodiments, the first resonance device further comprises a second active layer, which is located on the fourth side and disposed on the first intermediate layer, wherein the second active layer comprises a fourth piezoelectric layer, and a seventh electrode layer and an eighth electrode layer which are respectively located on two sides of the fourth piezoelectric layer, and the seventh electrode layer is located on the first sub-reflection layers or the second sub-reflection layers. In some embodiments, the fourth piezoelectric layer comprises a third protruding part located over the seventh electrode layer.

In some embodiments, the at least one resonance device comprises a second resonance device, wherein the second resonance device comprises a second intermediate layer, the second intermediate layer has a fifth side and a sixth side opposite to the fifth side, and the passive device is located on the fifth side. In some embodiments, the second resonance device further comprises a fifth piezoelectric layer and a ninth electrode layer, wherein the fifth piezoelectric layer is located on the sixth side and disposed on the second intermediate layer, the ninth electrode layer is located on the fifth piezoelectric layer, and the second intermediate layer and the ninth electrode layer are respectively located on two sides of the fifth piezoelectric layer.

In some embodiments, the second intermediate layer is made of, but not limited to, at least one of the following materials: polymer, insulating dielectric and polysilicon.

In embodiments, the ninth electrode layer comprises first electrode bars and second electrode bars, wherein the first electrode bars and the second electrode bars are arranged alternately, and the polarity of the first electrode bars is different from that of the second electrode bars. In some embodiments, the ninth electrode layer comprises an inter-digital transducer.

In some embodiments, the second resonance device further comprises a third intermediate layer, wherein the third intermediate layer is located on the fifth side, disposed between the passive device and the second intermediate layer and used to block leaky waves. The second intermediate layer and the third intermediate layer are made of different materials. In some embodiments, the third intermediate layer is made of, but not limited to, at least one of the following materials: polymer, insulating dielectric and polysilicon.

In some embodiments, the second intermediate layer further comprises third sub-reflection layers and fourth sub-reflection layers, wherein the third sub-reflection layers and the fourth sub-reflection layers are arranged alternately and are made of different materials. In some embodiments, the thickness of the third sub-reflection layers is different from that of the fourth sub-reflection layers. In some embodiments, the second intermediate layer further comprises a Bragg reflector.

An embodiment of the invention further provides an RF front-end device which comprises, but is not limited to, at least one first filter device provided by one of the aforementioned embodiments, and a power amplification device connected to the first filter device.

An embodiment of the invention further provides an RF front-end device which comprises, but is not limited to, at least one second filter device provided by one of the aforementioned embodiments, and a low-noise amplification device connected to the second filter device.

An embodiment of the invention further provides an RF front-end device which comprises, but is not limited to, a multiplexing device, wherein the multiplexing device comprises at least one third filter device provided by one of the aforementioned embodiments.

An embodiment of the invention further provides a wireless communication device which comprises, but is not limited to, the RF front-end device provided by one of the aforementioned embodiments, an antenna connected to a first terminal of the RF front-end device, and a baseband processing device connected to a second terminal of the RF front-end device.

Figure 1:
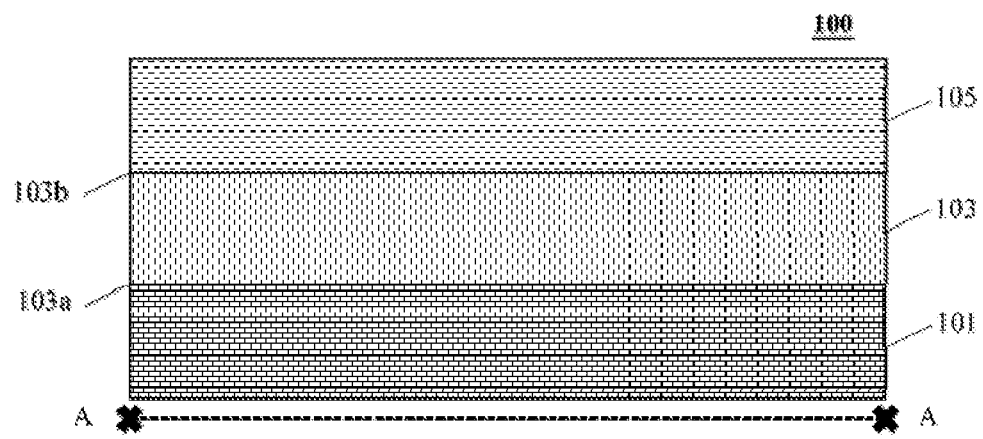
FIG. 1 is a structural diagram of cross-section A of a filter device 100 in an embodiment of the invention.

It should be noted that cross-section A and cross-section B are two orthogonal cross-sections.

DETAILED DESCRIPTION OF THE INVENTION

To gain a better understanding of the purposes, features and advantages of the invention, the specific implementations of the invention are expounded below in conjunction with the accompanying drawings.

Many specific details are given in the following description to obtain a comprehensive appreciation of the invention. Clearly, the invention can also be implemented through other embodiments different from those described hereinafter. Hence, the invention is not limited to the specific embodiments disclosed below.

As described in the description of related art, electrical connection of one resonance device and one IPD (for example, an ASW resonance device or a BAW resonance device is located in a die, and the IPD is located in another die) will occupy more space in the RF front-end chip and will increase the manufacturing cost.

The inventor of the invention finds that a resonance device (such as an SAW or BAW resonance device) and a passive device (such as an IPD) can be integrated in one die to form an RF filter device, which can broaden the pass-band width, has a high out-of-band rejection, and occupies less space in an RF front-end chip.

The inventor of the invention also finds that compared with electrical connection of one resonance device and one passive device, the integration of the resonance device and the passive device in one die can reduce electrical transmission losses, thus improving the filter performance.

An embodiment of the invention provides a filter device, which comprises a substrate, a passive device and at least one resonance device, wherein the passive device has a first side and a second side opposite to the first side, the substrate is located on the first side, and the at least one resonance device is located on the second side. The substrate, the passive device and the at least one resonance device are located in a die. The at least one resonance device is electrically connected to the passive device.

It should be noted that the filter device formed by integrating the at least one resonance device and the passive device in one die can broaden the pass-band width, has a high out-of-band rejection, and occupies less space in an RF front-end chip. In addition, the at least one resonance device is electrically connected to the passive device by means of a through hole in the filter device, so that the electrical transmission distance is shortened, and electrical transmission losses are reduced, accordingly.

In some embodiments, the passive device comprises, but is not limited to, at least one of a capacitor, an inductor, a resistor and a through hole. In some embodiments, the passive device includes, but is not limited to, an IPD, wherein the IPD is formed through a semiconductor process.

In some embodiments, the at least one resonance device includes, but is not limited to, at least one of an SAW resonance device and a BAW resonance device.

In some embodiments, the at least one resonance device includes a first resonance device, wherein the first resonance device comprises a first intermediate layer, the first intermediate layer has a third side and a fourth side opposite to the third side, and the passive device is located on the third side. In some embodiments, the first intermediate layer is made of, but not limited to, at least one of the following materials: polymer, insulating dielectric and polysilicon.

In some embodiments, the first intermediate layer further has a first cavity located in the fourth side. In some embodiments, the first resonance device further comprises a first electrode layer, a first piezoelectric layer and a second electrode layer, wherein at least one terminal of the first electrode layer is located in the first cavity; the first piezoelectric layer is located on the fourth side and is disposed on the first electrode layer, and the first piezoelectric layer is a flat layer and at least covers the first cavity; the second electrode layer is located on the first piezoelectric layer; and the first electrode layer and the second electrode layer are respectively located on two sides of the first piezoelectric layer.

In some embodiments, the first intermediate layer further has a first cavity located in the fourth side. In some embodiments, the first resonance device further comprises a third electrode layer, a second piezoelectric layer and a fourth electrode layer, wherein the third electrode layer is located on the first cavity and covers the first cavity, the second piezoelectric layer is located on the fourth side and disposed over the first intermediate layer and at least covers the third electrode layer, the fourth electrode layer is located on the second piezoelectric layer, and the third electrode layer and the fourth electrode layer are respectively located on two sides of the second piezoelectric layer.

In some embodiments, the first resonance device further comprises a first reflection layer, which is located on the fourth side and disposed over the first intermediate layer, wherein the first reflection layer is of, but not limited to, at least one of the following shapes: trapezoidal shape, arch shape and rectangular shape. In some embodiments, the first reflection layer has a second cavity.

In some embodiments, the first resonance device further comprises a first active layer, which is located on the first intermediate layer and covers the first reflection layer, wherein the first active layer comprises a third piezoelectric layer, and a fifth electrode layer and a sixth electrode layer which are respectively located on two sides of the third piezoelectric layer. In some embodiments, the fifth electrode layer comprises a first protruding part located on the first reflection layer, wherein the first protruding part is of, but not limited to, at least one of the following shapes: trapezoidal shape, arch shape and rectangular shape. In some embodiments, the third piezoelectric layer comprises a second protruding part located over the first protruding part, wherein the second protruding part is of, but not limited to, at least one of the following shapes: trapezoidal shape, arch shape and rectangular shape.

In some embodiments, the first intermediate layer further comprises first sub-reflection layers and second sub-reflection layers, wherein the first sub-reflection layers and the second sub-reflection layers are arranged alternately and are made of different materials. In some embodiments, the thickness of the first sub-reflection layers is different from that of the second sub-reflection layers. In some embodiments, the first intermediate layer further comprises a Bragg reflector.

In some embodiments, the first resonance device further comprises a second active layer, which is located on the fourth side and disposed on the first intermediate layer, wherein the second active layer comprises a fourth piezoelectric layer, and a seventh electrode layer and an eighth electrode layer which are respectively located on two sides of the fourth piezoelectric layer, and the seventh electrode layer is located on the first sub-reflection layers or the second sub-reflection layers. In some embodiments, the fourth piezoelectric layer comprises a third protruding part located over the seventh electrode layer.

In some embodiments, the at least one resonance device comprises a second resonance device, wherein the second resonance device comprises a second intermediate layer, the second intermediate layer has a fifth side and a sixth side opposite to the fifth side, and the passive device is located on the fifth side. In some embodiments, the second resonance device further comprises a fifth piezoelectric layer and a ninth electrode layer, wherein the fifth piezoelectric layer is located on the sixth side and disposed on the second intermediate layer, the ninth electrode layer is located on the fifth piezoelectric layer, and the second intermediate layer and the ninth electrode layer are respectively located on two sides of the fifth piezoelectric layer.

In some embodiments, the second intermediate layer is made of, but not limited to, at least one of the following materials: polymer, insulating dielectric and polysilicon.

In some embodiments, the ninth electrode layer comprises first electrode bars and second electrode bars, wherein the first electrode bars and the second electrode bars are arranged alternately, and the polarity of the first electrode bars is different from that of the second electrode bars. In some embodiments, the ninth electrode layer comprises an interdigital transducer.

In some embodiments, the second resonance device further comprises a third intermediate layer, wherein the third intermediate layer is located on the fifth side, disposed between the passive device and the second intermediate layer and used to block leaky waves. The second intermediate layer and the third intermediate layer are made of different materials. In some embodiments, the third intermediate layer is made of, but not limited to, at least one of the following materials: polymer, insulating dielectric and polysilicon.

In some embodiments, the second intermediate layer further comprises third sub-reflection layers and fourth sub-reflection layers, wherein the third sub-reflection layers and the fourth sub-reflection layers are arranged alternately and are made of different materials. In some embodiments, the thickness of the third sub-reflection layers is different from that of the fourth sub-reflection layers. In some embodiments, the second intermediate layer further comprises a Bragg reflector.

An embodiment of the invention further provides an RF front-end device, which comprises, but is not limited to, at least one first filter device provided by one of the aforementioned embodiments, and a power amplification device connected to the first filter device.

An embodiment of the invention further provides an RF front-end device, which comprises, but is not limited to, at least one second filter device provided by one of the aforementioned embodiments, and a low-noise amplification device connected to the second filter device.

An embodiment of the invention further provides an RF front-end device, which comprises, but is not limited to, a multiplexing device, wherein the multiplexing device comprises at least one third filter device provided by one of the aforementioned embodiments.

An embodiment of the invention further provides a wireless communication device, which comprises, but is not limited to, the RF front-end device provided by one of the aforementioned embodiments, an antenna connected to a first terminal of the RF front-end device, and a baseband processing device connected to a second terminal of the RF front-end device.

FIG. 1 to FIG. 12 illustrate multiple specific embodiments of the invention. The multiple specific embodiments adopt resonance devices of different structures. Clearly, the invention can also be implemented through other embodiments different from those described hereinafter. Hence, the invention is not limited to the specific embodiments described below.

FIG. 1 is a structural diagram of cross-section A of a filter device 100 in an embodiment of the invention.

As shown in FIG. 1, an embodiment of the invention provides a filter device 100, which comprises a substrate 101, a passive device 103 and at least one resonance device 105, wherein the substrate 101 is a die substrate, the passive device 103 is disposed over the substrate 101, and the at least one resonance device 105 is disposed over the passive device 103.

In this embodiment, the substrate 101 is located on a first side 103a of the passive device 103, and the at least one resonance device 105 is located on a second side 103b of the passive device. In this embodiment, the substrate 101, the passive device 103 and the at least one resonance device 105 are located in a die. In this embodiment, the at least one resonance device 105 is electrically connected to the passive device 103.

In this embodiment, the substrate 101 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the passive device 103 comprises, but is not limited to, at least one of a capacitor, an inductor, a resistor and a through hole. It should be noted that any passive devices (such as IPDs) known by those skilled in the art can be applied to the embodiments of the invention.

In this embodiment, the at least one resonance device 105 includes, but is not limited to, at least one of an SAW resonance device and a BAW resonance device.

It should be noted that the filter device formed by integrating the resonance device and the passive device in one die can broaden the pass-band width, has a high out-of-band rejection, and occupies less space in an RF front-end chip.

Figure 2A:
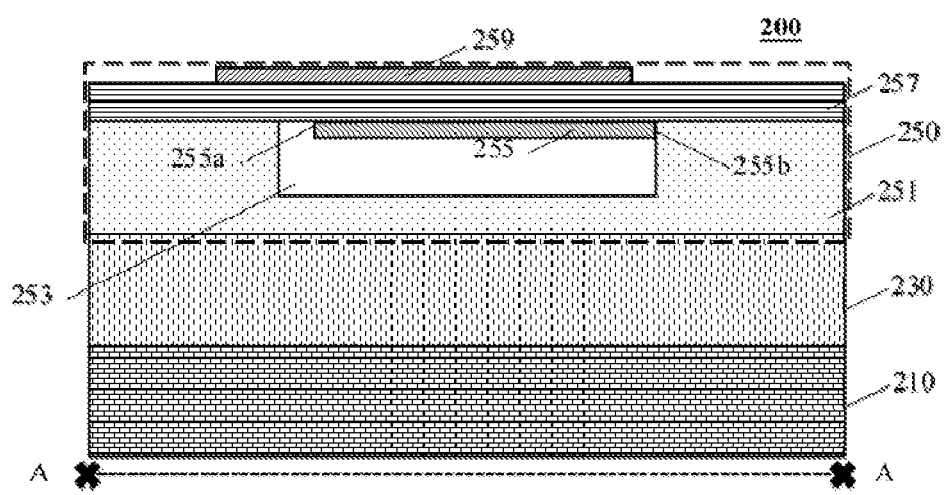
FIG. 2a is a structural diagram of cross-section A of a filter device 200 in an embodiment of the invention.

FIG. 2a is a structural diagram of cross-section A of a filter device 200 in an embodiment of the invention.

As shown in FIG. 2a, an embodiment of the invention provides a filter device 200, which comprises a substrate 210, a passive device 230 and a BAW resonance device 250, wherein the substrate 210 is a die substrate, the passive device 230 is disposed over the substrate 210, and the BAW resonance device 250 is disposed over the passive device 230.

In this embodiment, the substrate 210 and the BAW resonance device 250 are respectively located on two sides of the passive device 230. In this embodiment, the substrate 210, the passive device 230 and the BAW resonance device 250 are located in a die. In this embodiment, the BAW resonance device 250 is electrically connected to the passive device 230.

In this embodiment, the substrate 210 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the passive device 230 comprises, but is not limited to, at least one of a capacitor, an inductor, a resistor and a through hole. It should be noted that any passive devices (such as IPDs) known by those skilled in the art can be applied to the embodiments of the invention.

In this embodiment, the BAW resonance device 250 comprises an intermediate layer 251, an electrode layer 255, a piezoelectric layer 257 and an electrode layer 259, wherein the intermediate layer 251 is located on the passive device 230, and a cavity 253 is formed in the upper surface of the intermediate layer 251; the electrode layer 255 is located in the cavity 253; the piezoelectric layer 257 is located on the electrode layer 255, the passive device 230 and the piezoelectric layer 257 are respectively located on two sides of the intermediate layer 251, and the piezoelectric layer 257 is a flat layer and covers the cavity 253; the electrode layer 259 is located on the piezoelectric layer 257; and a resonance region (namely, an overlap region of the electrode layer 255 and the electrode layer 259) is suspended with respect to the cavity 253 and does not overlap with the intermediate layer 251.

In this embodiment, the intermediate layer 251 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, a first terminal 255a of the electrode layer 255 is located in the cavity 253, and a second terminal 255b of the electrode layer 255 is also located in the cavity 253 and contacts with the side wall of the cavity 253, wherein the second terminal 255b is opposite to the first terminal 255a. In another embodiment, the second terminal of the lower electrode layer is located in the cavity and does not contact with the side wall of the cavity. In this embodiment, the electrode layer 255 is made of, but not limited to, at least one of the following materials: molybdenum, ruthenium, tungsten, platinum, iridium and aluminum.

In this embodiment, the piezoelectric layer 257 covers the upper surface of the intermediate layer 251. In this embodiment, the piezoelectric layer 257 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the piezoelectric layer 257 comprises multiple crystals, wherein the multiple crystals include a first crystal and a second crystal, and the first crystal and the second crystal are any two crystals of the multiple crystals. As is known to those skilled in the art that the orientation and plane of crystals can be represented by coordinate systems.

Figure 2B:
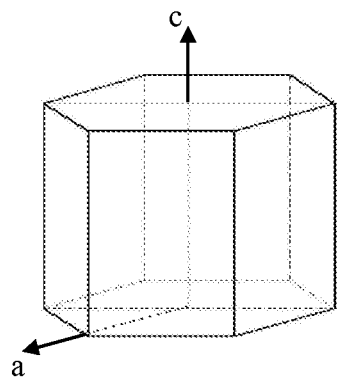
FIG. 2b is a structural diagram of a crystal of a hexagonal system.
Figure 2C:
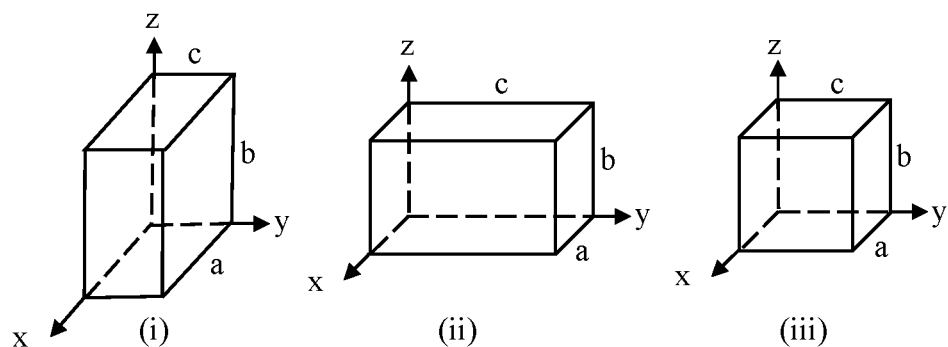
FIG. 2c is structural diagrams of crystals showing: (i) a structural diagram of a crystal of an orthorhombic system; (ii) a structural diagram of a crystal of a tetragonal system; and (iii) a structural diagram of a crystal of a cubic system.

For example, as shown in FIG. 2b, a crystal of a hexagonal system, such as an aluminum nitride crystal, can be represented by an ac three-dimensional coordinate system (including an a-axis and a c-axis). For another example, as shown in FIG. 2c, crystals of an orthorhombic system ($a \neq b \neq c$) (i), a tetragonal system ($a = b \neq c$) (ii) and a cubic system ($a = b = c$) (iii) can be represented by an xyz three-dimensional coordinate system (including an x-axis, a y-axis and a z-axis). In addition to these two examples, the crystals can also be represented by other coordinate systems known by those skilled in the art, and thus, the invention is not limited to the two aforementioned examples.

In this embodiment, the first crystal may be represented by a first three-dimensional coordinate system, and the second crystal may be represented by a second three-dimensional coordinate system, wherein the first three-dimensional coordinate system at least includes a first coordinate axis in a first direction and a third coordinate axis in a third direction, the second three-dimensional coordinate system at least includes a second coordinate axis in a second direction and a fourth coordinate axis in a fourth direction, the first coordinate axis corresponds to the height of the first crystal, and the second coordinate axis corresponds to the height of the second crystal.

In this embodiment, the first direction is identical with or opposite to the second direction. It should be noted that when the first direction is identical with the second direction, an angle between a vector in the first direction and a vector in the second direction ranges from 0° to 5°, and that when the first direction is opposite to the second direction, the angle between the vector in the first direction and the vector in the second direction ranges from 175° to 180°.

In another embodiment, the first three-dimensional coordinate system is an ac three-dimensional coordinate system, wherein the first coordinate axis is a first c-axis, and the third coordinate axis is a first a-axis; and the second three-dimensional coordinate system is also an ac three-dimensional coordinate system, wherein the second coordinate axis is a second c-axis, the fourth coordinate axis is a second a-axis, and the first c-axis and the second c-axis are in the same direction or in opposite directions.

In another embodiment, the first three-dimensional coordinate system further includes a fifth coordinate axis in a fifth direction, and the second three-dimensional coordinate system further includes a sixth coordinate axis in a sixth direction. In another embodiment, the first direction is identical with or opposite to the second direction, and the third direction is identical with or opposite to the fourth direction. It should be noted that when the third direction is identical with the fourth direction, an angle between a vector in the third direction and a vector in the fourth direction ranges from 0° to 5°, and that when the third direction is opposite to the fourth direction, the angle between the vector in the third direction and the vector in the fourth direction ranges from 175° to 180°.

In another embodiment, the first three-dimensional coordinate system is an xyz three-dimensional coordinate system, wherein the first coordinate axis is a first z-axis, the third coordinate axis is a first y-axis, and the fifth coordinate axis is a first x-axis; and the second three-dimensional coordinate system is also an xyz three-dimensional coordinate system, wherein the second coordinate axis is a second z-axis, the fourth coordinate axis is a second y-axis, and the sixth coordinate axis is a second x-axis. In another embodiment, the first z-axis and the second z-axis are in the same direction, and the first y-axis and the second y-axis are in the same direction. In another embodiment, the first z-axis and the second z-axis are in opposite directions, and the first y-axis and the second y-axis are in opposite directions. In another embodiment, the first z-axis and the second z-axis are in the same direction, and the first y-axis and the second y-axis are in opposite directions. In another embodiment, the first z-axis and the second z-axis are in opposite directions, and the first y-axis and the second y-axis are in the same direction.

In this embodiment, the piezoelectric layer 257 comprises multiple crystals, wherein the full width at half maximum (FWHM) of rocking curves of the multiple crystals is less than 2.5°. It should be noted that the rocking curve depicts the angular divergence of a specific crystal plane (determined by the diffraction angle) on a sample and is represented by a planar coordinate system, wherein the horizontal axis represents the angle between the crystal plane and the sample, the vertical axis represents the diffraction intensity of the crystal plane under a certain angle, the rocking curve indicates the crystal lattice quality, and the smaller the FWHM, the higher the crystal lattice quality. In addition, the FWHM indicates the distance between points with two consecutive functional values equal to half of the peak value in one peak of a function.

It should be noted that the piezoelectric layer 257 formed on a plane does not comprise distinctly turning crystals, so that the electromechanical coupling coefficient and Q value of the resonance device are increased.

In this embodiment, the electrode layer 259 is made of, but not limited to, at least one of the following materials: molybdenum, ruthenium, tungsten, platinum, iridium and aluminum.

It should be noted that the filter device formed by integrating the BAW resonance device and the passive device in one die can broaden the pass-band width, has a high out-of-band rejection, and occupies less space in an RF front-end chip.

Figure 3:
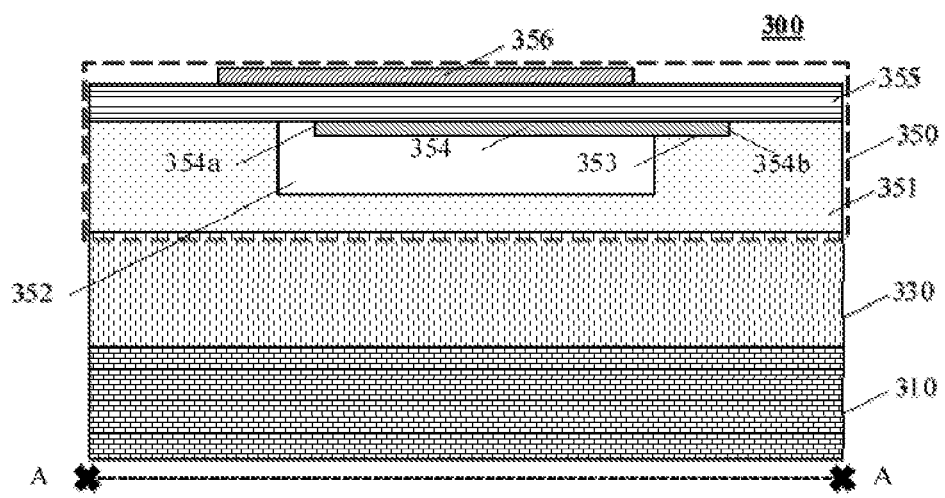
FIG. 3 is a structural diagram of cross-section A of a filter device 300 in an embodiment of the invention.

FIG. 3 is a structural diagram of cross-section A of a filter device 300 in an embodiment of the invention.

As shown in FIG. 3, an embodiment of the invention provides a filter device 300, which comprises a substrate 310, a passive device 330 and a BAW resonance device 350, wherein the substrate 310 is a die substrate, the passive device 330 is disposed over the substrate 310, and the BAW resonance device 350 is disposed over the passive device 330.

In this embodiment, the substrate 310 and the BAW resonance device 350 are respectively located on two sides of the passive device 330. In this embodiment, the substrate 310, the passive device 330 and the BAW resonance device 350 are located in a die. In this embodiment, the BAW resonance device 350 is electrically connected to the passive device 330.

In this embodiment, the substrate 310 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the passive device 330 comprises, but is not limited to, at least one of a capacitor, an inductor, a resistor and a through hole. It should be noted that any passive devices (such as IPDs) known by those skilled in the art can be applied to the embodiments of the invention.

In this embodiment, the BAW resonance device 350 comprises an intermediate layer 351, an electrode layer 354, a piezoelectric layer 355 and an electrode layer 356, wherein the intermediate layer 351 is located on the passive device 330, a cavity 352 and a groove 353 are formed in the upper surface of the intermediate layer 351, and the groove 353 is located on one side of the cavity 352 and communicated with the cavity 352 and has a depth smaller than that of the cavity 352; a first terminal 354a of the electrode layer 354 is located in the cavity 352, a second terminal 354b of the electrode layer 354 is located in the groove 353, and the second terminal 354b is opposite to the first terminal 354a; the piezoelectric layer 355 is located on the electrode layer 354, the passive device 330 and the piezoelectric layer 355 are respectively located on two sides of the intermediate layer 351, and the piezoelectric layer 355 is a flat layer and covers the cavity 352; the electrode layer 356 is located on the piezoelectric layer 355; and a resonance region (namely, an overlap region of the electrode layer 354 and the electrode layer 356) is suspended with respect to the cavity 352 and does not overlap with the intermediate layer 351.

In this embodiment, the intermediate layer 351 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, the depth of the groove 353 is equal to the thickness of the electrode layer 354.

In this embodiment, the electrode layer 354 is made of, but not limited to, at least one of the following materials: molybdenum, ruthenium, tungsten, platinum, iridium and aluminum.

In this embodiment, the piezoelectric layer 355 covers the upper surface of the intermediate layer 351. In this embodiment, the piezoelectric layer 355 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the piezoelectric layer 355 comprises multiple crystals, wherein the multiple crystals include a first crystal and a second crystal, and the first crystal and the second crystal are any two crystals of the multiple crystals. As is known to those skilled in the art, the orientation and plane of crystals can be represented by coordinate systems.

In this embodiment, the first crystal may be represented by a first three-dimensional coordinate system, and the second crystal may be represented by a second three-dimensional coordinate system, wherein the first three-dimensional coordinate system at least includes a first coordinate axis in a first direction and a third coordinate axis in a third direction, the second three-dimensional coordinate system at least includes a second coordinate axis in a second direction and a fourth coordinate axis in a fourth direction, the first coordinate axis corresponds to the height of the first crystal, and the second coordinate axis corresponds to the height of the second crystal.

In this embodiment, the first direction is identical with or opposite to the second direction. It should be noted that when the first direction is identical with the second direction, an angle between a vector in the first direction and a vector in the second direction ranges from 0° to 5°, and that when the first direction is opposite to the second direction, the angle between the vector in the first direction and the vector in the second direction ranges from 175° to 180°.

In another embodiment, the first three-dimensional coordinate system is an ac three-dimensional coordinate system, wherein the first coordinate axis is a first c-axis, and the third coordinate axis is a first a-axis; and the second three-dimensional coordinate system is also an ac three-dimensional coordinate system, wherein the second coordinate axis is a second c-axis, the fourth coordinate axis is a second a-axis, and the first c-axis and the second c-axis are in the same direction or in opposite directions.

In another embodiment, the first three-dimensional coordinate system further includes a fifth coordinate axis in a fifth direction, and the second three-dimensional coordinate system further includes a sixth coordinate axis in a sixth direction. In another embodiment, the first direction is identical with or opposite to the second direction, and the third direction is identical with or opposite to the fourth direction. It should be noted that when the third direction is identical with the fourth direction, an angle between a vector in the third direction and a vector in the fourth direction ranges from 0° to 5°, and that when the third direction is opposite to the fourth direction, the angle between the vector in the third direction and the vector in the fourth direction ranges from 175° to 180°.

In another embodiment, the first three-dimensional coordinate system is an xyz three-dimensional coordinate system, wherein the first coordinate axis is a first z-axis, the third coordinate axis is a first y-axis, and the fifth coordinate axis is a first x-axis; and the second three-dimensional coordinate system is also an xyz three-dimensional coordinate system, wherein the second coordinate axis is a second z-axis, the fourth coordinate axis is a second y-axis, and the sixth coordinate axis is a second x-axis. In another embodiment, the first z-axis and the second z-axis are in the same direction, and the first y-axis and the second y-axis are in the same direction. In another embodiment, the first z-axis and the second z-axis are in opposite directions, and the first y-axis and the second y-axis are in opposite directions. In another embodiment, the first z-axis and the second z-axis are in the same direction, and the first y-axis and the second y-axis are in opposite directions. In another embodiment, the first z-axis and the second z-axis are in opposite directions, and the first y-axis and the second y-axis are in the same direction.

In this embodiment, the piezoelectric layer 355 comprises multiple crystals, wherein the FWHM of rocking curves of the multiple crystals is less than 2.5°.

It should be noted that the piezoelectric layer 355 formed on a plane does not comprise distinctly turning crystals, so that the electromechanical coupling coefficient and Q value of the resonance device are increased.

In this embodiment, the electrode layer 356 is made of, but not limited to, at least one of the following materials: molybdenum, ruthenium, tungsten, platinum, iridium and aluminum.

It should be noted that the filter device formed by integrating the BAW resonance device and the passive device in one die can broaden the pass-band width, has a high out-of-band rejection, and occupies less space in an RF front-end chip.

Figure 4:
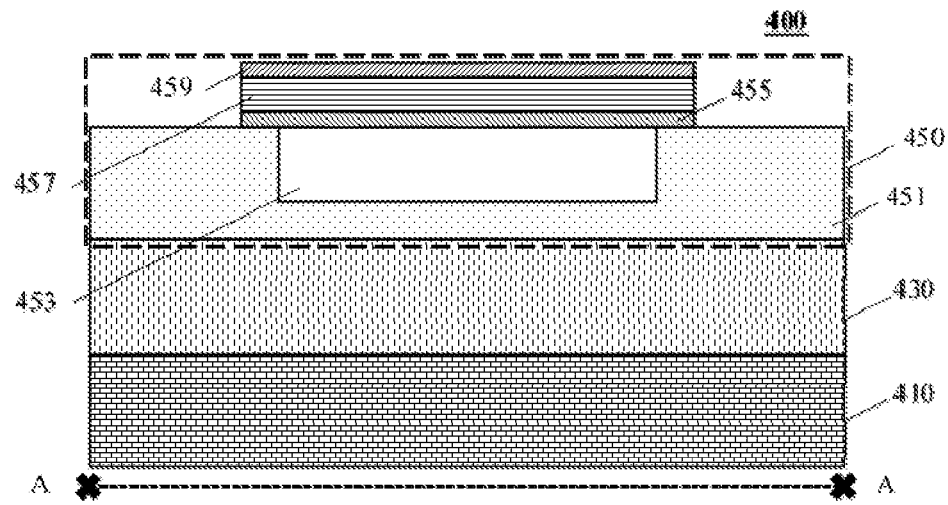
FIG. 4 is a structural diagram of cross-section A of a filter device 400 in an embodiment of the invention.

FIG. 4 is a structural diagram of cross-section A of a filter device 400 in an embodiment of the invention.

As shown in FIG. 4, an embodiment of the invention provides a filter device 400, which comprises a substrate 410, a passive device 430 and a BAW resonance device 450, wherein the substrate 410 is a die substrate, the passive device 430 is disposed over the substrate 410, and the BAW resonance device 450 is disposed over the passive device 430.

In this embodiment, the substrate 410 and the BAW resonance device 450 are respectively located on two sides of the passive device 430. In this embodiment, the substrate 410, the passive device 430 and the BAW resonance device 450 are located in a die. In this embodiment, the BAW resonance device 450 is electrically connected to the passive device 430.

In this embodiment, the substrate 410 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the passive device 430 comprises, but is not limited to, at least one of a capacitor, an inductor, a resistor and a through hole. It should be noted that any passive devices (such as IPDs) known by those skilled in the art can be applied to the embodiments of the invention.

In this embodiment, the BAW resonance device 450 comprises an intermediate layer 451, an electrode layer 455, a piezoelectric layer 457 and an electrode layer 459, wherein the intermediate layer 451 is located on the passive device 430, and a cavity 453 is formed in the upper surface of the intermediate layer 451; the electrode layer 455 is located on the cavity 453 and covers the cavity 453, and the passive device 430 and the electrode layer 455 are respectively located on two sides of the intermediate layer 451; the piezoelectric layer 457 is located on the electrode layer 455; the electrode layer 459 is located on the piezoelectric layer 457; and a resonance region (namely, an overlap region of the electrode layer 455 and the electrode layer 459) overlaps with the intermediate layer 451, wherein overlap parts are respectively located on two sides of the cavity 453.

In this embodiment, the intermediate layer 451 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, the electrode layer 455 is located on the intermediate layer 451. In this embodiment, the electrode layer 455 is made of, but not limited to, at least one of the following materials: molybdenum, ruthenium, tungsten, platinum, iridium and aluminum.

In this embodiment, the piezoelectric layer 457 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the electrode layer 459 is made of, but not limited to, at least one of the following materials: molybdenum, ruthenium, tungsten, platinum, iridium and aluminum.

It should be noted that the filter device formed by integrating the BAW resonance device and the passive device in one die can broaden the pass-band width, has a high out-of-band rejection, and occupies less space in an RF front-end chip.

Figure 5:
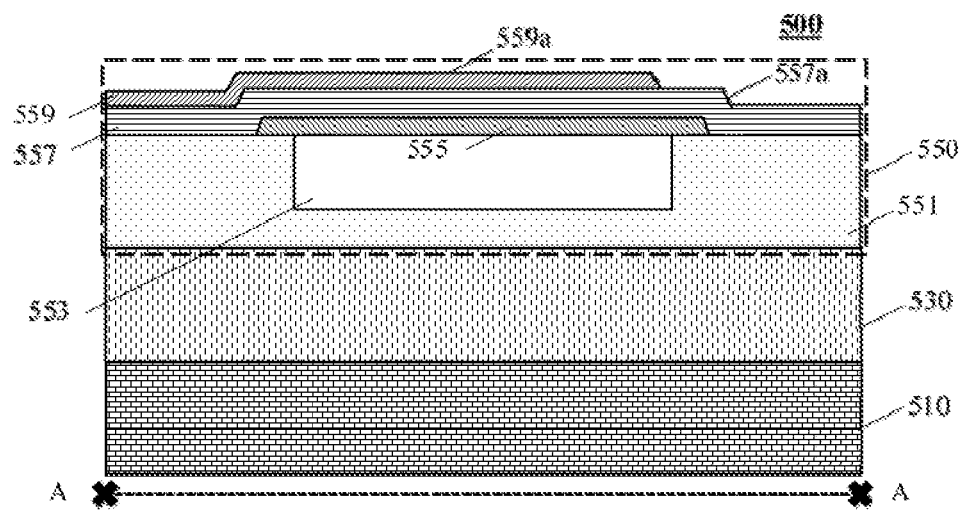
FIG. 5 is a structural diagram of cross-section A of a filter device 500 in an embodiment of the invention.

FIG. 5 is a structural diagram of cross-section A of a filter device in an embodiment of the invention.

As shown in FIG. 5, an embodiment of the invention provides a filter device 500, which comprises a substrate 510, a passive device 530 and a BAW resonance device 550, wherein the substrate 510 is a die substrate, the passive device 530 is disposed over the substrate 510, and the BAW resonance device 550 is disposed over the passive device 530.

In this embodiment, the substrate 510 and the BAW resonance device 550 are respectively located on two sides of the passive device 530. In this embodiment, the substrate 510, the passive device 530 and the BAW resonance device 550 are located in a die. In this embodiment, the BAW resonance device 550 is electrically connected to the passive device 530.

In this embodiment, the substrate 510 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the passive device 530 comprises, but is not limited to, at least one of a capacitor, an inductor, a resistor and a through hole. It should be noted that any passive devices (such as IPDs) known by those skilled in the art can be applied to the embodiments of the invention.

In this embodiment, the BAW resonance device 550 comprises an intermediate layer 551, an electrode layer 555, a piezoelectric layer 557 and an electrode layer 559, wherein the intermediate layer 551 is located on the passive device 530, and a cavity 553 is formed in the upper surface of the intermediate layer 551; the electrode layer 555 is located on the cavity 553 and covers the cavity 553, and the passive device 530 and the electrode layer 555 are respectively located on two sides of the intermediate layer 551; the piezoelectric layer 557 is located on the intermediate layer 551, covers the electrode layer 555 and comprises a protruding part 557a located over the electrode layer 555; the electrode layer 559 is located on the piezoelectric layer 557 and comprises a protruding part 559a located on the protruding part 557a; and a resonance region (namely, an overlap region of the electrode layer 555 and the electrode layer 559) overlaps with the intermediate layer 551, wherein an overlap part is located on one side of the cavity 553.

In this embodiment, the intermediate layer 551 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, the electrode layer 555 is located on the intermediate layer 551. In this embodiment, the electrode layer 555 is made of, but not limited to, at least one of the following materials: molybdenum, ruthenium, tungsten, platinum, iridium and aluminum. In this embodiment, cross-section A of the electrode layer 555 is trapezoidal. In another embodiment, cross-section A of the lower electrode layer is rectangular.

In this embodiment, the piezoelectric layer 557 covers the upper surface of the intermediate layer 551. In this embodiment, the piezoelectric layer 557 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the protruding height of the protruding part 557a is greater than or equal to the thickness of the electrode layer 555. In this embodiment, cross-section A of the protruding part 557a is trapezoidal. In another embodiment, cross-section A of the first protruding part is rectangular.

In this embodiment, the electrode layer 559 is made of, but not limited to, at least one of the following materials: molybdenum, ruthenium, tungsten, platinum, iridium and aluminum.

In this embodiment, the protruding height of the protruding part 559a is greater than or equal to the thickness of the electrode layer 555. In this embodiment, cross-section A of the protruding part 559a is trapezoidal. In another embodiment, cross-section A of the second protruding part is rectangular.

It should be noted that the filter device formed by integrating the BAW resonance device and the passive device in one die can broaden the pass-band width, has a high out-of-band rejection, and occupies less space in an RF front-end chip.

Figure 6:
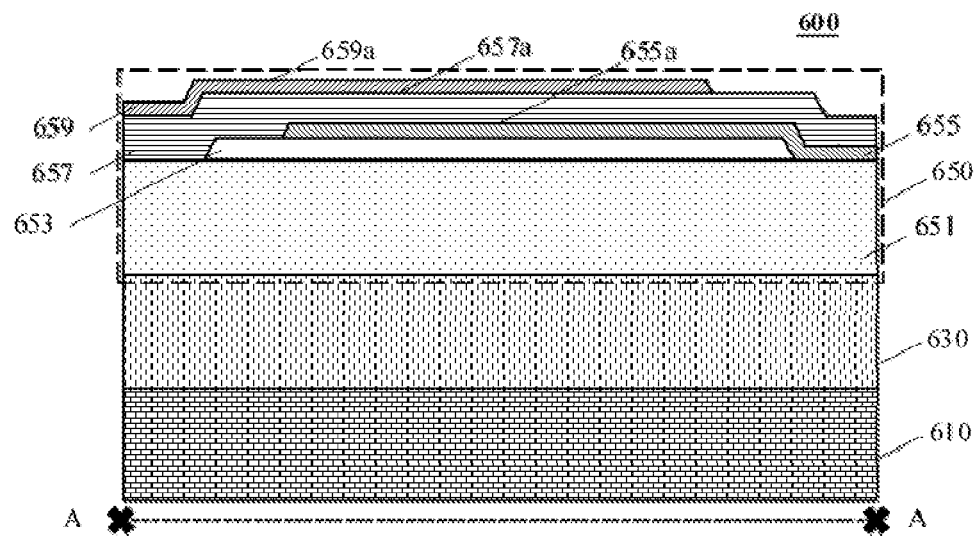
FIG. 6 is a structural diagram of cross-section A of a filter device 600 in an embodiment of the invention.

FIG. 6 is a structural diagram of cross-section A of a filter device 600 in an embodiment of the invention.

As shown in FIG. 6, an embodiment of the invention provides a filter device 600, which comprises a substrate 610, a passive device 630 and a BAW resonance device 650, wherein the substrate 610 is a die substrate, the passive device 630 is disposed over the substrate 610, and the BAW resonance device 650 is disposed over the passive device 630.

In this embodiment, the substrate 610 and the BAW resonance device 650 are respectively located on two sides of the passive device 630. In this embodiment, the substrate 610, the passive device 630 and the BAW resonance device 650 are located in a die. In this embodiment, the BAW resonance device 650 is electrically connected to the passive device 630.

In this embodiment, the substrate 610 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the passive device 630 comprises, but is not limited to, at least one of a capacitor, an inductor, a resistor and a through hole. It should be noted that any passive devices (such as IPDs) known by those skilled in the art can be applied to the embodiments of the invention.

In this embodiment, the BAW resonance device 650 comprises an intermediate layer 651, a reflection layer 653, an electrode layer 655, a piezoelectric layer 657 and an electrode layer 659, wherein the intermediate layer 651 is located on the passive device 630 and is used to block leaky waves; the reflection layer 653 is located on the intermediate layer 651, and the passive device 630 and the reflection layer 653 are respectively located on two sides of the intermediate layer 651; the electrode layer 655 is located on the intermediate layer 651 and comprises a protruding part 655a located on the reflection layer 653; the piezoelectric layer 657 is located on the intermediate layer 651 and comprises a protruding part 657a located over the protruding part 655a;

the electrode layer 659 is located on the piezoelectric layer 657 and comprises a protruding part 659a located on the protruding part 657a; a resonance region (namely, an overlap region of the electrode layer 655 and the electrode layer 659) is located over the reflection layer 653; and the electrode layer 655, the piezoelectric layer 657 and the electrode layer 659 form an active layer of the BAW resonance device 650, and the active layer covers the reflection layer 653.

In this embodiment, the intermediate layer 651 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, cross-section A of the reflection layer 653 is trapezoidal. In this embodiment, the reflection layer 653 is a cavity. In another embodiment, the reflection layer comprises a material or structure for reflecting acoustic waves.

In this embodiment, the electrode layer 655 is made of, but not limited to, at least one of the following materials: molybdenum, ruthenium, tungsten, platinum, iridium and aluminum.

In this embodiment, the protruding height of the protruding part 655a is greater than or equal to the thickness of the reflection layer 653 (namely, the depth of the cavity 653). In this embodiment, cross-section A of the protruding part 655a is trapezoidal. In another embodiment, cross-section A of the first protruding part is rectangular.

In this embodiment, the piezoelectric layer 657 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the protruding height of the protruding part 657a is greater than or equal to the thickness of the reflection layer 653 (namely, the depth of the cavity 653). In this embodiment, cross-section A of the protruding part 657a is trapezoidal. In another embodiment, cross-section A of the second protruding part is rectangular.

In this embodiment, the electrode layer 659 is made of, but not limited to, at least one of the following materials: molybdenum, ruthenium, tungsten, platinum, iridium and aluminum.

In this embodiment, the protruding height of the protruding part 659a is greater than or equal to the thickness of the reflection layer 653 (namely, the depth of the cavity 653). In this embodiment, cross-section A of the protruding part 659a is trapezoidal. In another embodiment, cross-section A of the third protruding part is rectangular.

It should be noted that the filter device formed by integrating the BAW resonance device and the passive device in one die can broaden the pass-band width, has a high out-of-band rejection, and occupies less space in an RF front-end chip.

Figure 7:
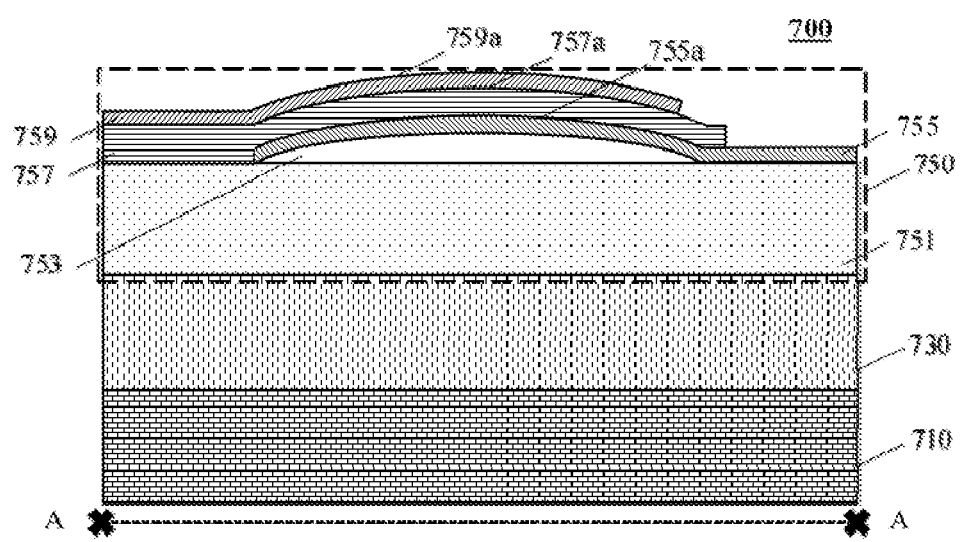
FIG. 7 is a structural diagram of cross-section A of a filter device 700 in an embodiment of the invention.

FIG. 7 is a structural diagram of cross-section A of a filter device 700 in an embodiment of the invention.

As shown in FIG. 7, an embodiment of the invention provides a filter device 700, which comprises a substrate 710, a passive device 730 and a BAW resonance device 750, wherein the substrate 710 is a die substrate, the passive device 730 is disposed over the substrate 710, and the BAW resonance device 750 is disposed over the passive device 730.

In this embodiment, the substrate 710 and the BAW resonance device 750 are respectively located on two sides of the passive device 730. In this embodiment, the substrate 710, the passive device 730 and the BAW resonance device 750 are located in a die. In this embodiment, the BAW resonance device 750 is electrically connected to the passive device 730.

In this embodiment, the substrate 710 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the passive device 730 comprises, but is not limited to, at least one of a capacitor, an inductor, a resistor and a through hole. It should be noted that any passive devices (such as IPDs) known by those skilled in the art can be applied to the embodiments of the invention.

In this embodiment, the BAW resonance device 750 comprises an intermediate layer 751, a reflection layer 753, an electrode layer 755, a piezoelectric layer 757 and an electrode layer 759, wherein the intermediate layer 751 is located on the passive device 730 and is used to block leaky waves; the reflection layer 753 is located on the intermediate layer 751, and the passive device 730 and the reflection layer 753 are respectively located on two sides of the intermediate layer 751; the electrode layer 755 is located on the intermediate layer 751 and comprises a protruding part 755a located on the reflection layer 753; the piezoelectric layer 757 is located on the intermediate layer 751 and comprises a protruding part 757a located over the protruding part 755a; the electrode layer 759 is located on the piezoelectric layer 757 and comprises a protruding part 759a located on the protruding part 657a; a resonance region (namely, an overlap region of the electrode layer 755 and the electrode layer 759) is located over the reflection layer 753; the electrode layer 755, the piezoelectric layer 757 and the electrode layer 759 form an active layer of the BAW resonance device 750, and the active layer covers the reflection layer 753; and cross-section A of the reflection layer is arched.

In this embodiment, the intermediate layer 751 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, the reflection layer 753 is a cavity. In another embodiment, the reflection layer comprises a material or structure for reflecting acoustic waves.

In this embodiment, the electrode layer 755 is made of, but not limited to, at least one of the following materials: molybdenum, ruthenium, tungsten, platinum, iridium and aluminum.

In this embodiment, the protruding height of the protruding part 755a is greater than or equal to the thickness of the reflection layer 753 (namely, the depth of the cavity 753). In this embodiment, cross-section A of the protruding part 755a is arched.

In this embodiment, the piezoelectric layer 757 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the protruding height of the protruding part 757a is greater than or equal to the thickness of the reflection layer 753 (namely, the depth of the cavity 753). In this embodiment, cross-section A of the protruding part 757a is arched.

In this embodiment, the electrode layer 759 is made of, but not limited to, at least one of the following materials: molybdenum, ruthenium, tungsten, platinum, iridium and aluminum.

In this embodiment, the protruding height of the protruding part 759a is greater than or equal to the thickness of the reflection layer 753 (namely, the depth of the cavity 753). In this embodiment, cross-section A of the protruding part 759a is arched.

It should be noted that the filter device formed by integrating the BAW resonance device and the passive device in one die can broaden the pass-band width, has a high out-of-band rejection, and occupies less space in an RF front-end chip.

Figure 8:
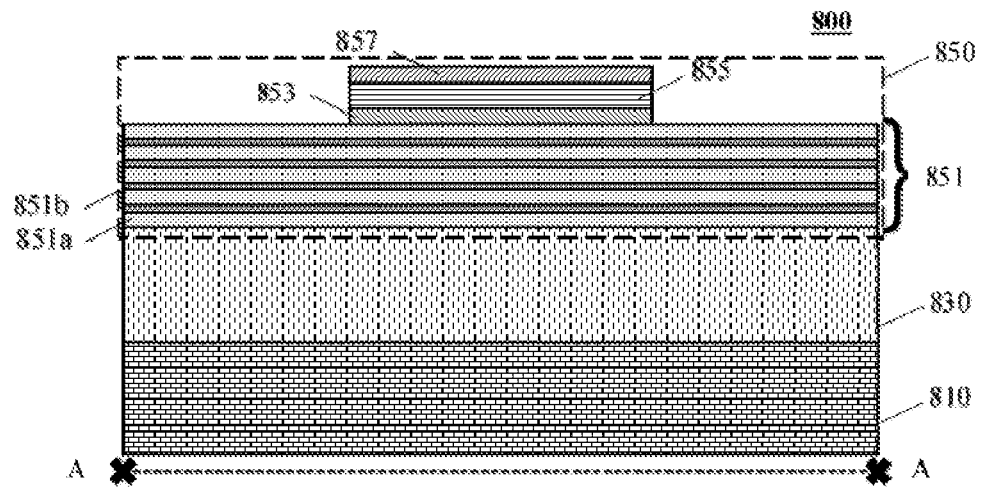
FIG. 8 is a structural diagram of cross-section A of a filter device 800 in an embodiment of the invention.

FIG. 8 is a structural diagram of cross-section A of a filter device 800 in an embodiment of the invention.

As shown in FIG. 8, an embodiment of the invention provides a filter device 800, which comprises a substrate 810, a passive device 830 and a BAW resonance device 850, wherein the substrate 810 is a die substrate, the passive device 830 is disposed over the substrate 810, and the BAW resonance device 850 is disposed over the passive device 830.

In this embodiment, the substrate 810 and the BAW resonance device 850 are respectively located on two sides of the passive device 830. In this embodiment, the substrate 810, the passive device 830 and the BAW resonance device 850 are located in a die. In this embodiment, the BAW resonance device 850 is electrically connected to the passive device 830.

In this embodiment, the substrate 810 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the passive device 830 comprises, but is not limited to, at least one of a capacitor, an inductor, a resistor and a through hole. It should be noted that any passive devices (such as IPDs) known by those skilled in the art can be applied to the embodiments of the invention.

In this embodiment, the BAW resonance device 850 comprises a reflection layer 851, an electrode layer 853, a piezoelectric layer 855 and an electrode layer 857, wherein the reflection layer 851 is located on the passive device 830; the electrode layer 853 is located on the reflection layer 851, and the passive device 830 and the electrode layer 853 are respectively located on two sides of the reflection layer 851; the piezoelectric layer 855 is located on the electrode layer 853; the electrode layer 857 is located on the piezoelectric layer 855; and the reflection layer 851 comprises multiple sub-reflection layers 851a and multiple sub-reflection layers 851b, and the sub-reflection layers 851a and the sub-reflection layers 851b are stacked alternately.

In this embodiment, the sub-reflection layers 851a and the sub-reflection layers 851b are made of different materials, so that the acoustic impedance of the sub-reflection layers 851a is different from that of the sub-reflection layers 851b. In this embodiment, the sub-reflection layers 851a are made of, but not limited to, at least one of the following materials: silicon oxycarbide, silicon nitride, silicon dioxide, aluminum nitride, tungsten and molybdenum. In this embodiment, the sub-reflection layers 851b are made of, but not limited to, at least one of the following materials: silicon oxycarbide, silicon nitride, silicon dioxide, aluminum nitride, tungsten and molybdenum.

In this embodiment, the reflection layer 851 is a quarter-wave Bragg mirror. In this embodiment, the thickness of the sub-reflection layers 851a is twice that of the sub-reflection layers 851b. In another embodiment, the sub-reflection layers have the same thickness. It should be noted that the quarter-wave Bragg mirror in this embodiment is merely a specific example which is not intended to limit the invention, and all other acoustic reflection layers known by those skilled in the art can be applied to the embodiments of the invention.

In this embodiment, the electrode layer 853 is made of, but not limited to, at least one of the following materials: molybdenum, ruthenium, tungsten, platinum, iridium and aluminum.

In this embodiment, the piezoelectric layer 855 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the electrode layer 857 is made of, but not limited to, at least one of the following materials: molybdenum, ruthenium, tungsten, platinum, iridium and aluminum.

It should be noted that the filter device formed by integrating the BAW resonance device and the passive device in one die can broaden the pass-band width, has a high out-of-band rejection, and occupies less space in an RF front-end chip.

Figure 9:
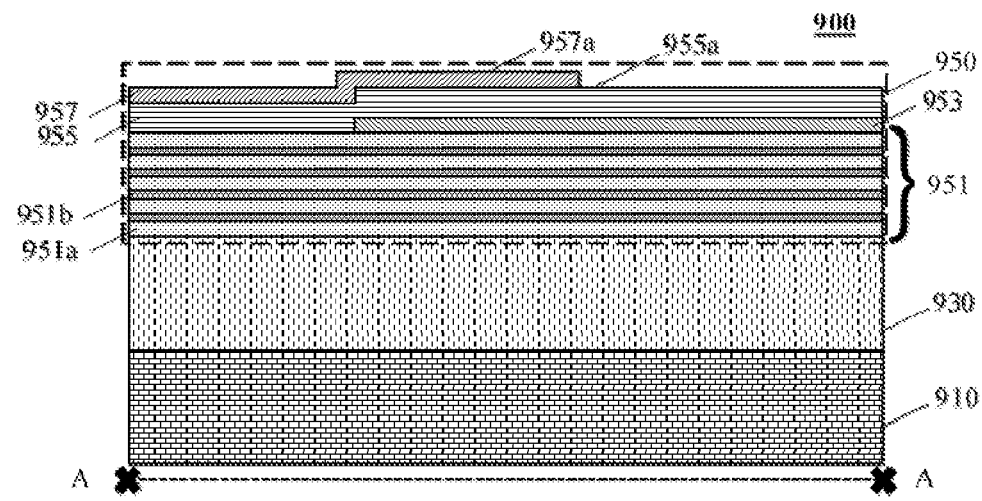
FIG. 9 is a structural diagram of cross-section A of a filter device 900 in an embodiment of the invention.

FIG. 9 is a structural diagram of cross-section A of a filter device 900 in an embodiment of the invention.

As shown in FIG. 9, an embodiment of the invention provides a filter device 900, which comprises a substrate 910, a passive device 930 and a BAW resonance device 950, wherein the substrate 910 is a die substrate, the passive device 930 is disposed over the substrate 910, and the BAW resonance device 950 is disposed over the passive device 930.

In this embodiment, the substrate 910 and the BAW resonance device 950 are respectively located on two sides of the passive device 930. In this embodiment, the substrate 910, the passive device 930 and the BAW resonance device 950 are located in a die. In this embodiment, the BAW resonance device 950 is electrically connected to the passive device 930.

In this embodiment, the substrate 910 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the passive device 930 comprises, but is not limited to, at least one of a capacitor, an inductor, a resistor and a through hole. It should be noted that any passive devices (such as IPDs) known by those skilled in the art can be applied to the embodiments of the invention.

In this embodiment, the BAW resonance device 950 comprises a reflection layer 951, an electrode layer 953, a piezoelectric layer 955 and an electrode layer 957, wherein the reflection layer 951 is located on the passive device 930; the electrode layer 953 is located on the reflection layer 951, and the passive device 930 and the electrode layer 953 are respectively located on two sides of the reflection layer 951; the piezoelectric layer 955 is located on the reflection layer 951 and comprises a protruding part 955a located over the electrode layer 953; the electrode layer 957 is located on the piezoelectric layer 955 and comprises a protruding part 957a located on the protruding part 955a; the electrode layer 953 partially overlaps with the protruding part 957a; and the reflection layer 951 comprises multiple sub-reflection layers 951a and multiple sub-reflection layers 951b, and the sub-reflection layers 951a and the sub-reflection layers 951b are stacked alternately.

In this embodiment, the sub-reflection layers 951a and the sub-reflection layers 951b are made of different materials, so that the acoustic impedance of the sub-reflection layers 951a is different from that of the sub-reflection layers 951b. In this embodiment, the sub-reflection layers 851a are made of, but not limited to, at least one of the following materials: silicon oxycarbide, silicon nitride, silicon dioxide, aluminum nitride, tungsten and molybdenum. In this embodiment, the sub-reflection layers 851b are made of, but not limited to, at least one of the following materials: silicon oxycarbide, silicon nitride, silicon dioxide, aluminum nitride, tungsten and molybdenum.

In this embodiment, the reflection layer 951 is a quarter-wave Bragg mirror. In this embodiment, the thickness of the sub-reflection layers 951a is twice that of the sub-reflection layers 951b. In another embodiment, the sub-reflection layers have the same thickness. It should be noted that the quarter-wave Bragg mirror in this embodiment is merely a specific example which is not intended to limit the invention, and all other acoustic reflection layers known by those skilled in the art can be applied to the embodiments of the invention.

In this embodiment, the electrode layer 953 is made of, but not limited to, at least one of the following materials: molybdenum, ruthenium, tungsten, platinum, iridium and aluminum. In this embodiment, cross-section A of the electrode layer 953 is rectangular. In another embodiment, cross-section A of the lower electrode layer is trapezoidal.

In this embodiment, the piezoelectric layer 955 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the height of the protruding part 955a is greater than or equal to the thickness of the electrode layer 953. In this embodiment, cross-section A of the protruding part 955a is rectangular. In another embodiment, cross-section A of the first protruding part is trapezoidal.

In this embodiment, the electrode layer 957 is made of, but not limited to, at least one of the following materials: molybdenum, ruthenium, tungsten, platinum, iridium and aluminum.

In this embodiment, the height of the protruding part 957a is greater than or equal to the thickness of the electrode layer 953. In this embodiment, cross-section A of the protruding part 957a is rectangular. In another embodiment, cross-section A of the second protruding part is trapezoidal.

It should be noted that the filter device formed by integrating the BAW resonance device and the passive device in one die can broaden the pass-band width, has a high out-of-band rejection, and occupies less space in an RF front-end chip.

Figure 10:
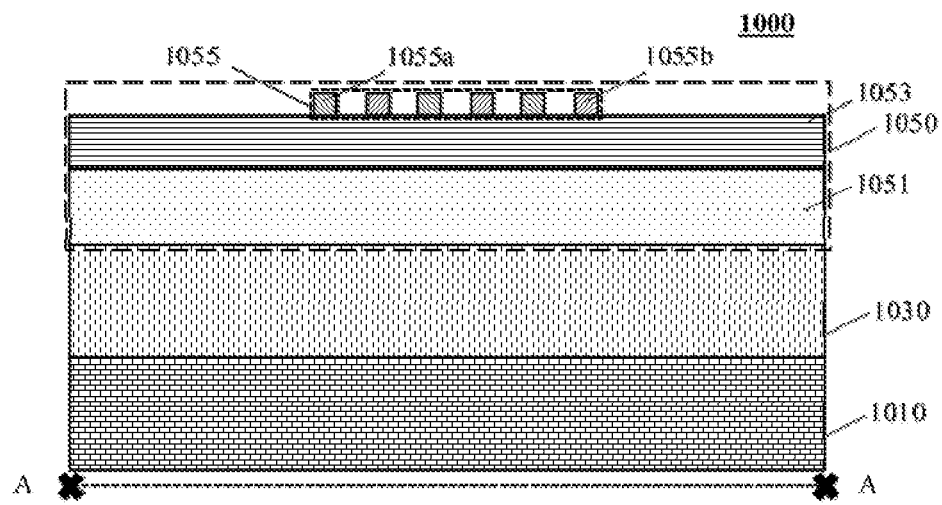
FIG. 10 is a structural diagram of cross-section A of a filter device 1000 in an embodiment of the invention.

FIG. 10 is a structural diagram of cross-section A of a filter device 1000 in an embodiment of the invention.

As shown in FIG. 10, an embodiment of the invention provides a filter device 1000, which comprises a substrate 1010, a passive device 1030 and an SAW resonance device 1050, wherein the substrate 1010 is a die substrate, the passive device 1030 is disposed over the substrate 1010, and the SAW resonance device 1050 is disposed over the passive device 1030.

In this embodiment, the substrate 1010 and the SAW resonance device 1050 are respectively located on two sides of the passive device 1030. In this embodiment, the substrate 1010, the passive device 1030 and the SAW resonance device 1050 are located in a die. In this embodiment, the SAW resonance device 1050 is electrically connected to the passive device 1030.

In this embodiment, the substrate 1010 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the passive device 1030 comprises, but is not limited to, at least one of a capacitor, an inductor, a resistor and a through hole. It should be noted that any passive devices (such as IPDs) known by those skilled in the art can be applied to the embodiments of the invention.

In this embodiment, the SAW resonance device 1050 comprises an intermediate layer 1051, a piezoelectric layer 1053 and an electrode layer 1055, wherein the intermediate layer 1051 is located on the passive device 1030 and is used to block leaky waves; the piezoelectric layer 1053 is located on the intermediate layer 1051, and the passive device 1030 and the piezoelectric layer 1053 are respectively located on two sides of the 1051; and the electrode layer 1055 is located on the piezoelectric layer 1053 and comprises multiple electrode bars 1055a and multiple electrode bars 1055b.

In this embodiment, the intermediate layer 1051 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, the piezoelectric layer 1053 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the polarity of the multiple electrode bars 1055a is different from that of the multiple electrode bars 1055b. In this embodiment, the electrode bars 1055a and the electrode bars 1055b are arranged alternately. In this embodiment, the distances between the adjacent electrode bars 1055a and the adjacent electrode bars 1055b are equal.

In this embodiment, the electrode layer 1055 comprises an interdigital transducer (IDT).

It should be noted that the filter device formed by integrating the SAW resonance device and the passive device in one die can broaden the pass-band width, has a high out-of-band rejection, and occupies less space in an RF front-end chip.

Figure 11:
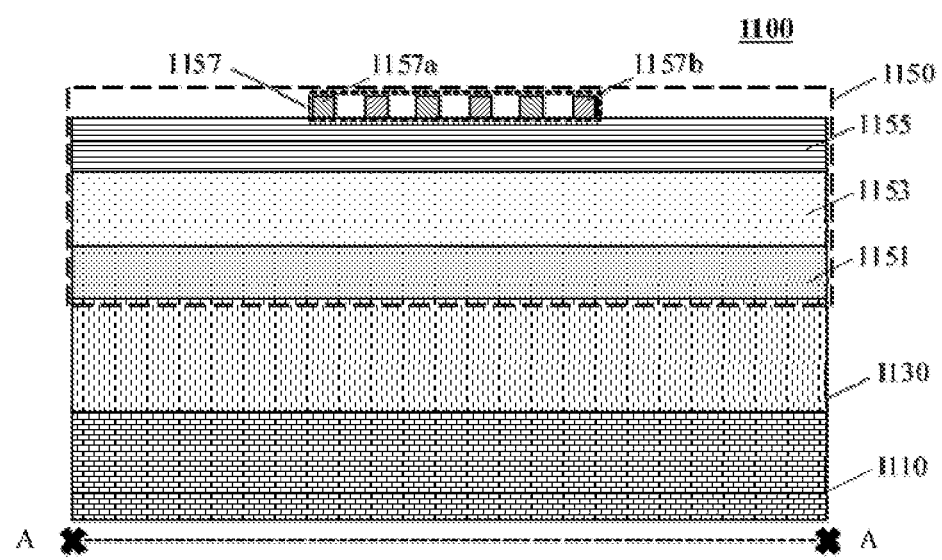
FIG. 11 is a structural diagram of cross-section A of a filter device 1100 in an embodiment of the invention.

FIG. 11 is a structural diagram of cross-section A of a filter device 1100 in an embodiment of the invention.

As shown in FIG. 11, an embodiment of the invention provides a filter device 1100, which comprises a substrate 1110, a passive device 1130 and an SAW resonance device 1150, wherein the substrate 1110 is a die substrate, the passive device 1130 is disposed over the substrate 1110, and the SAW resonance device 1150 is disposed over the passive device 1130.

In this embodiment, the substrate 1110 and the SAW resonance device 1150 are respectively located on two sides of the passive device 1130. In this embodiment, the substrate 1110, the passive device 1130 and the SAW resonance device 1150 are located in a die. In this embodiment, the SAW resonance device 1150 is electrically connected to the passive device 1130.

In this embodiment, the substrate 1110 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the passive device 1130 comprises, but is not limited to, at least one of a capacitor, an inductor, a resistor and a through hole. It should be noted that any passive devices (such as IPDs) known by those skilled in the art can be applied to the embodiments of the invention.

In this embodiment, the SAW resonance device 1150 comprises an intermediate layer 1151, an intermediate layer 1153, a piezoelectric layer 1155 and an electrode layer 1157, wherein the intermediate layer 1151 is located on the passive device 1130; the intermediate layer 1153 is located on the intermediate layer 1151, and the passive device 1130 and the intermediate layer 1153 are respectively located on two sides of the intermediate layer 1151; the piezoelectric layer 1155 is located on the intermediate layer 1153; and the electrode layer 1157 is located on the piezoelectric layer 1155 and comprises multiple electrode bars 1157a and multiple electrode bars 1157b, wherein the intermediate layer 1151 and the intermediate layer 1153 are made of different materials, have different acoustic impedances, and are used to block leaky waves.

In this embodiment, the intermediate layer 1151 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, the intermediate layer 1153 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, the piezoelectric layer 1155 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the polarity of the multiple electrode bars 1157a is different from that of the multiple electrode bars 1157b. In this embodiment, the electrode bars 1157a and the electrode bars 1157b are arranged alternately. In this embodiment, the distances between the adjacent electrode bars 1157a and the adjacent electrode bars 1157b are equal.

In this embodiment, the electrode layer 1157 comprises an interdigital transducer (IDT).

It should be noted that the filter device formed by integrating the SAW resonance device and the passive device in one die can broaden the pass-band width, has a high out-of-band rejection, and occupies less space in an RF front-end chip.

Figure 12:
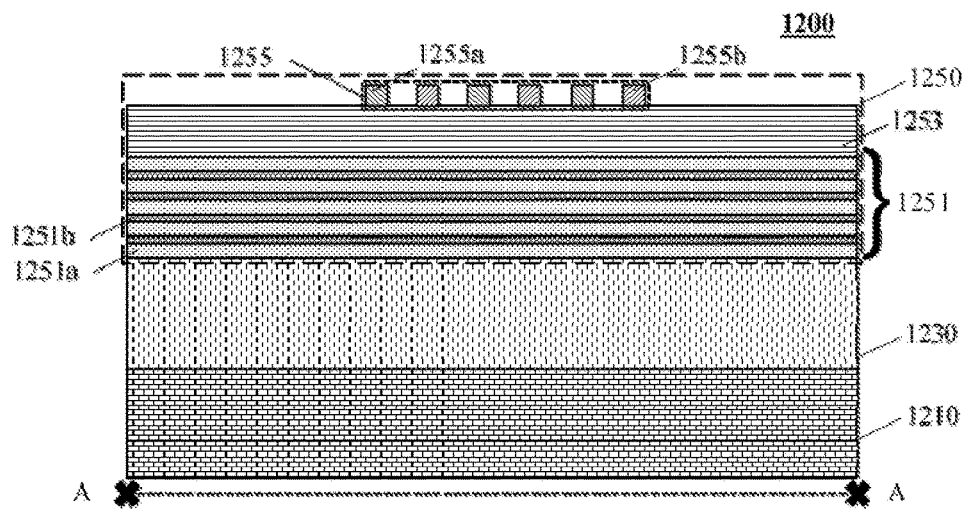
FIG. 12 is a structural diagram of cross-section A of a filter device 1200 in an embodiment of the invention.

FIG. 12 is a structural diagram of cross-section A of a filter device 1200 in an embodiment of the invention.

As shown in FIG. 12, an embodiment of the invention provides a filter device 1200, which comprises a substrate 1210, a passive device 1230 and an SAW resonance device 1250, wherein the substrate 1210 is a die substrate, the passive device 1230 is disposed over the substrate 1210, and the SAW resonance device 1250 is disposed over the passive device 1230.

In this embodiment, the substrate 1210 and the SAW resonance device 1250 are respectively located on two sides of the passive device 1230. In this embodiment, the substrate 1210, the passive device 1230 and the SAW resonance device 1250 are located in a die. In this embodiment, the SAW resonance device 1250 is electrically connected to the passive device 1230.

In this embodiment, the substrate 1210 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the passive device 1230 comprises, but is not limited to, at least one of a capacitor, an inductor, a resistor and a through hole. It should be noted that any passive devices (such as IPDs) known by those skilled in the art can be applied to the embodiments of the invention.

In this embodiment, the SAW resonance device 1250 comprises a reflection layer 1251, a piezoelectric layer 1253 and an electrode layer 1255, wherein the reflection layer 1251 is located on the passive device 1230; the piezoelectric layer 1253 is located on the reflection layer 1251, and the passive device 1230 and the piezoelectric layer 1253 are respectively located on two sides of the reflection layer 1251; the electrode layer 1255 is located on the piezoelectric layer 1253 and comprises multiple electrode bars 1255a and multiple electrode bars 1255b; the reflection layer 1251 comprises multiple sub-reflection layers 1251a and multiple sub-reflection layers 1251b, and the sub-reflection layers 1251a and the sub-reflection layers 1251b are stacked alternately.

In this embodiment, the sub-reflection layers 1251a and the sub-reflection layers 1251b are made of different materials, so that the acoustic impedance of the sub-reflection layers 1251a is different from that of the sub-reflection layers 1251b. In this embodiment, the sub-reflection layers 1251a are made of, but not limited to, at least one of the following materials: silicon oxycarbide, silicon nitride, silicon dioxide, aluminum nitride, tungsten and molybdenum. In this embodiment, the sub-reflection layers 1251b are made of, but not limited to, at least one of the following materials: silicon oxycarbide, silicon nitride, silicon dioxide, aluminum nitride, tungsten and molybdenum.

In this embodiment, the reflection layer 1251 is a quarter-wave Bragg mirror. In this embodiment, the thickness of the sub-reflection layers 1251a is twice that of the sub-reflection layers 1251b. In another embodiment, the sub-reflection layers have the same thickness. It should be noted that the quarter-wave Bragg mirror in this embodiment is merely a specific example which is not intended to limit the invention, and all other acoustic reflection layers known by those skilled in the art can be applied to the embodiments of the invention.

In this embodiment, the piezoelectric layer 1253 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the polarity of the multiple electrode bars 1255a is different from that of the multiple electrode bars 1255b. In this embodiment, the electrode bars 1255a and the electrode bars 1255b are arranged alternately. In this embodiment, the distances between the adjacent electrode bars 1255a and the adjacent electrode bars 1255b are equal.

In this embodiment, the electrode layer 1155 comprises an interdigital transducer (IDT).

It should be noted that the filter device formed by integrating the SAW resonance device and the passive device in one die can broaden the pass-band width, has a high out-of-band rejection, and occupies less space in an RF front-end chip.

FIG. 13 to FIG. 15 illustrate multiple specific embodiments, adopting different passive devices, of the invention. Clearly, the invention can also be implemented through other embodiments different from those described hereinafter. Hence, the invention is not limited to the specific embodiments disclosed below.

Figure 13A:
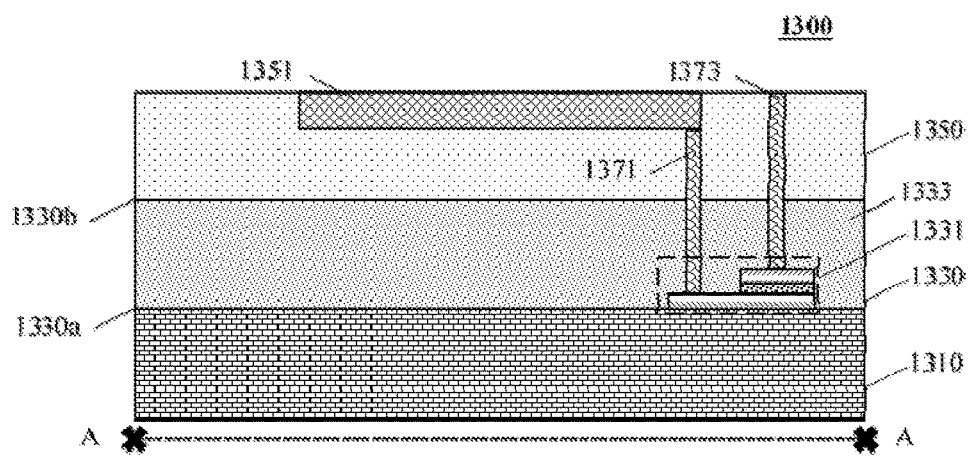
FIG. 13a is a structural diagram of cross-section A of a filter device 1300 in an embodiment of the invention.

FIG. 13a is a structural diagram of cross-section A of a filter device 1300 in an embodiment of the invention.

As shown in FIG. 13a, an embodiment of the invention provides a filter device 1300, which comprises a substrate 1310, a passive device 1330 and a resonance device 1350, wherein the substrate 1310 is a die substrate, the passive device 1330 is disposed over the substrate 1310, and the resonance device 1350 is disposed over the passive device 1330.

In this embodiment, the substrate 1310 is located on a first side 1330a of the passive device 1330, and the resonance device 1350 is located on a second side 1330b of the passive device 1330. In this embodiment, the substrate 1310, the passive device 1330 and the resonance device 1350 are located in a die.

In this embodiment, the substrate 1310 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the passive device 1330 comprises a capacitor 1331 and an intermediate layer 1333, wherein the capacitor 1331 is located on the substrate 1310, and the intermediate layer 1333 is located on the substrate 1310 and covers the capacitor 1331.

In this embodiment, the capacitor 1331 is a metal-insulator-metal (MIM) capacitor. In this embodiment, the capacitor 1331 is formed through a semiconductor process.

It should be noted that the MIM capacitor in this embodiment is merely a specific example which is not intended to limit the invention, and capacitors manufactured through other semiconductor processes known by those skilled in the art, such as metal-oxide-metal (MOM) capacitors, can also be applied to the embodiments of the invention.

In this embodiment, the intermediate layer 1333 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, the resonance device 1350 includes, but is not limited to, at least one of an SAW resonance device and a BAW resonance device. In this embodiment, the resonance device 1350 comprises an active region 1351, and the active region 1351 comprises a piezoelectric layer and at least one electrode layer.

In this embodiment, the filter device 1300 further comprises a through hole 1371 and a through hole 1373, wherein a first terminal of the through hole 1371 is electrically connected to one or more of the at least one electrode layer, a second terminal of the through hole 1371 is electrically connected to a first terminal of the capacitor 1331, a first terminal of the through hole 1373 is electrically connected to a second terminal of the capacitor 1331, and a second terminal of the through hole 1373 is grounded.

Figure 13B:
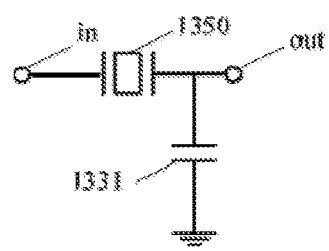
FIG. 13b is an equivalent circuit diagram of the filter device 1300 in the embodiment of the invention.

FIG. 13b is an equivalent circuit diagram of the filter device 1300 in this embodiment of the invention.

As shown in FIG. 13b, an equivalent circuit of the filter device 1300 comprises the resonance device 1350 and the capacitor 1331, wherein a first terminal of the resonance device 1350 is connected to an input terminal in, a second terminal of the resonance device 1350 is connected to the first terminal of the capacitor 1331 and is also connected to an output terminal out, the first terminal of the capacitor 1331 is also connected to the output terminal out, and the second terminal of the capacitor 1331 is grounded.

It should be noted that the filter device formed by integrating the resonance device and the passive device in one die can broaden the pass-band width, has a high out-of-band rejection, and occupies less space in an RF front-end chip. In addition, compared with electrical connection of one resonance device and one passive device, the integration of the resonance device and the passive device in one die can reduce electrical transmission losses (because the electrical transmission path is shorter), thus improving the filter performance.

Figure 14A:
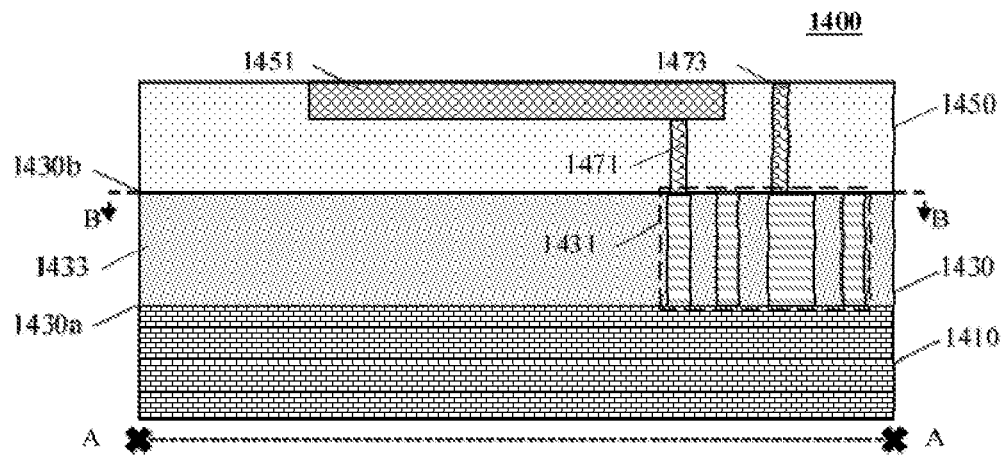
FIG. 14a is a structural diagram of cross-section A of a filter device 1400 in an embodiment of the invention.

FIG. 14a is a structural diagram of cross-section A of a filter device 1400 in an embodiment of the invention As shown in FIG. 14a, an embodiment of the invention provides a filter device 1400, which comprises a substrate 1410, a passive device 1430 and a resonance device 1450, wherein the substrate 1410 is a die substrate, the passive device 1430 is disposed over the substrate 1410, and the resonance device 1450 is disposed over the passive device 1430.

In this embodiment, the substrate 1410 is located on a first side 1430a of the passive device 1430, and the resonance device 1450 is located on a second side 1430b of the passive device 1430. In this embodiment, the substrate 1410, the passive device 1430 and the resonance device 1450 are located in a die.

In this embodiment, the substrate 1410 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the passive device 1430 comprises an inductor 1431 located on the substrate 1410 and an intermediate layer 1433 located on the substrate 1410, wherein the inductor 1431 is inlaid in the intermediate layer 1433.

In this embodiment, the inductor 1431 is a spiral inductor. In this embodiment, the inductor 1431 is formed through a semiconductor process. It should be noted that the spiral inductor in this embodiment is merely a specific example which is not intended to limit the invention, and inductors manufactured through other semiconductor processes known by those skilled in the art can also be applied to the embodiments of the invention.

In this embodiment, the thickness of the inductor 1431 is equal to that of the intermediate layer 1433. In another embodiment, the thickness of the inductor is smaller than that of the intermediate layer.

In this embodiment, the intermediate layer 1433 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, the resonance device 1450 includes, but is not limited to, at least one of an SAW resonance device and a BAW resonance device. In this embodiment, the resonance device 1450 comprises an active region 1451, and the active region 1451 comprises a piezoelectric layer and at least one electrode layer.

In this embodiment, the filter device 1400 further comprises a through hole 1471 and a through hole 1473, wherein a first terminal of the through hole 1471 is electrically connected to one or more of the at least one electrode layer, a second terminal of the through hole 1471 is electrically connected to a first terminal of the inductor 1431, a first terminal of the through hole 1473 is electrically connected to a second terminal of the inductor 1431, and a second terminal of the through hole 1473 is grounded.

Figure 14B:
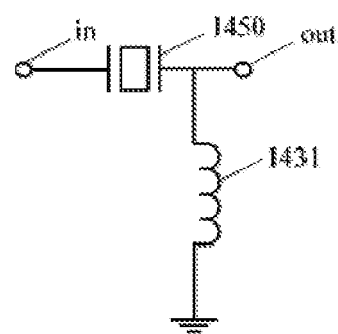
FIG. 14b is an equivalent circuit diagram of the filter device 1400 in the embodiment of the invention.

FIG. 14*b* is an equivalent circuit diagram of the filter device 1400 in this embodiment of the invention.

As shown in FIG. 14*b*, an equivalent circuit of the filter device 1400 comprises the resonance device 1450 and the inductor 1431, wherein a first terminal of the resonance device 1450 is connected to an input terminal in, a second terminal of the resonance device 1450 is connected to the first terminal of the inductor 1431 and is also connected to an output terminal out, the first terminal of the inductor 1431 is also connected to the output terminal out, and the second terminal of the inductor 1431 is grounded.

Figure 14C:
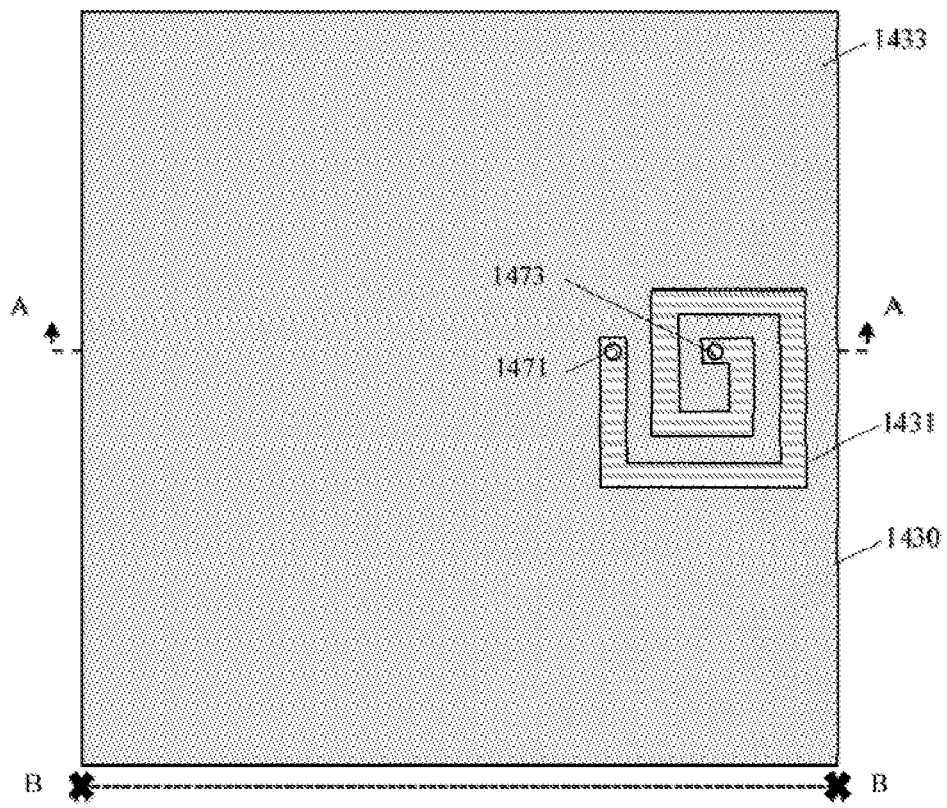
FIG. 14c is a structural diagram of cross-section B of the filter device 1400 in the embodiment of the invention.

FIG. 14*c* is a structural diagram of cross-section B of the filter device 1400 in this embodiment of the invention (that is, a top view of the passive device 1430).

As shown in FIG. 14*c*, in this embodiment, cross-section B of the inductor 1431 is quadrangular. In another embodiment, cross-section B of the inductor is of, but not limited to, one of the following shapes: pentagonal shape, hexagonal shape, octagonal shape, circular shape and oval shape. In this embodiment, the inductor 1431 comprises two layers of coils. In another embodiment, the inductor comprises three or more layers of coils. It should be noted that the spiral inductor in this embodiment is merely a specific example which is not intended to limit the invention, and other spiral inductors known by those skilled in the art can also be applied to the embodiments of the invention.

It should be noted that the filter device formed by integrating the resonance device and the passive device in one die can broaden the pass-band width, has a high out-of-band rejection, and occupies less space in an RF front-end chip. In addition, compared with electrical connection of one resonance device and one passive device, the integration of the resonance device and the passive device in one die can reduce electrical transmission losses (because the electrical transmission path is shorter), thus improving the filter performance.

Figure 15A:
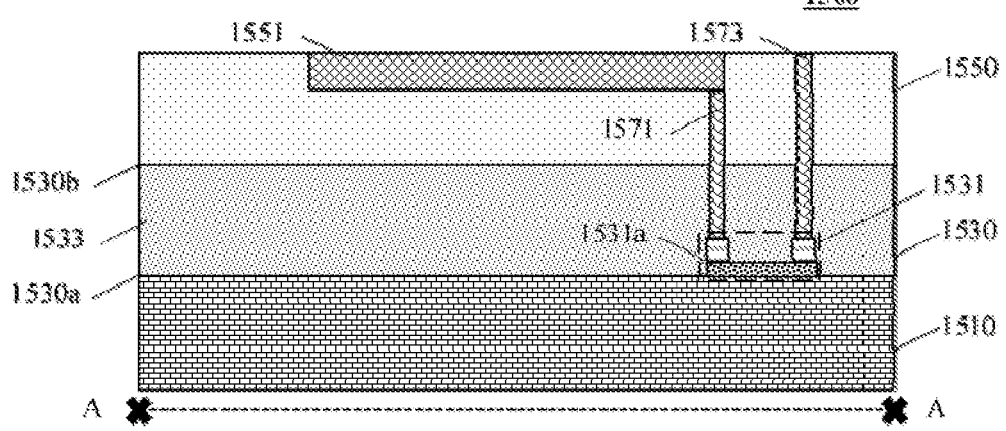
FIG. 15a is a structural diagram of cross-section A of a filter device 1500 in an embodiment of the invention.

FIG. 15*a* is a structural diagram of cross-section A of a filter device 1500 of an embodiment of the invention.

As shown in FIG. 15*a*, an embodiment of the invention provides a filter device 1500, which comprises a substrate 1510, a passive device 1530 and a resonance device 1550, wherein the substrate 1510 is a die substrate, the passive device 1530 is disposed over the substrate 1510, and the resonance device 1550 is disposed over the passive device 1530.

In this embodiment, the substrate 1510 is located on a first side 1530*a* of the passive device 1530, and the resonance device 1550 is located on a second side 1530*b* of the passive device 1530. In this embodiment, the substrate 1510, the passive device 1530 and the resonance device 1550 are located in a die.

In this embodiment, the substrate 1510 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the passive device 1530 comprises a resistor 1531 located on the substrate 1510 and an intermediate layer 1533 located on the substrate 1510 and covering the resistor 1531, wherein the resistor 1531 comprises a resistor layer 1531*a* located between the intermediate layer 1533 and the substrate 1510. In another embodiment, the resistor layer is located on the substrate and covers the substrate, and the intermediate layer is located on the resistor layer. In this embodiment, the resistor 1531 is formed through a semiconductor process. It should be noted that the resistor in this embodiment is merely a specific example which is not intended to limit the invention, and resistors manufactured through other semiconductor processes known by those skilled in the art can also be applied to the embodiments of the invention.

In this embodiment, the intermediate layer 1533 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, the resonance device 1550 includes, but is not limited to, at least one of an SAW resonance device and a BAW resonance device. In this embodiment, the resonance device 1550 comprises an active region 1551, and the active region 1551 comprises a piezoelectric layer and at least one electrode layer.

In this embodiment, the filter device 1500 further comprises a through hole 1571 and a through hole 1573, wherein a first terminal of the through hole 1571 is electrically connected to one or more of the at least one electrode layer, a second terminal of the through hole 1571 is electrically connected to a first terminal of the resistor 1531, a first terminal of the through hole 1573 is electrically connected to a second terminal of the resistor 1531, and a second terminal of the through hole 1573 is grounded.

Figure 15B:
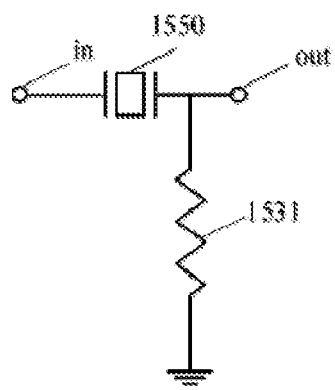
FIG. 15b is an equivalent circuit diagram of the filter device 1500 in the embodiment of the invention.

FIG. 15*b* is an equivalent circuit diagram of the filter device 1500 in this embodiment of the invention.

As shown in FIG. 15*b*, an equivalent circuit of the filter device 1500 comprises the resonance device 1550 and the resistor 1531, wherein a first terminal of the resonance device 1550 is connected to an input terminal in, a second terminal of the resonance device 1550 is connected to the first terminal of the resistor 1531 and is also connected to an output terminal out, the first terminal of the resistor 1531 is also connected to the output terminal out, and the second terminal of the resistor 1531 is grounded.

It should be noted that the filter device formed by integrating the resonance device and the passive device in one die can broaden the pass-band width, has a high out-of-band rejection, and occupies less space in an RF front-end chip. In addition, compared with electrical connection of one resonance device and one passive device, the integration of the resonance device and the passive device in one die can reduce electrical transmission losses (because the electrical transmission path is shorter), thus improving the filter performance.

FIG. 16 shows a specific embodiment of the invention. Obviously, the invention can also be implemented through other embodiments different from the one described herein. Hence, the invention is not limited to the specific embodiment disclosed below.

Figure 16A:
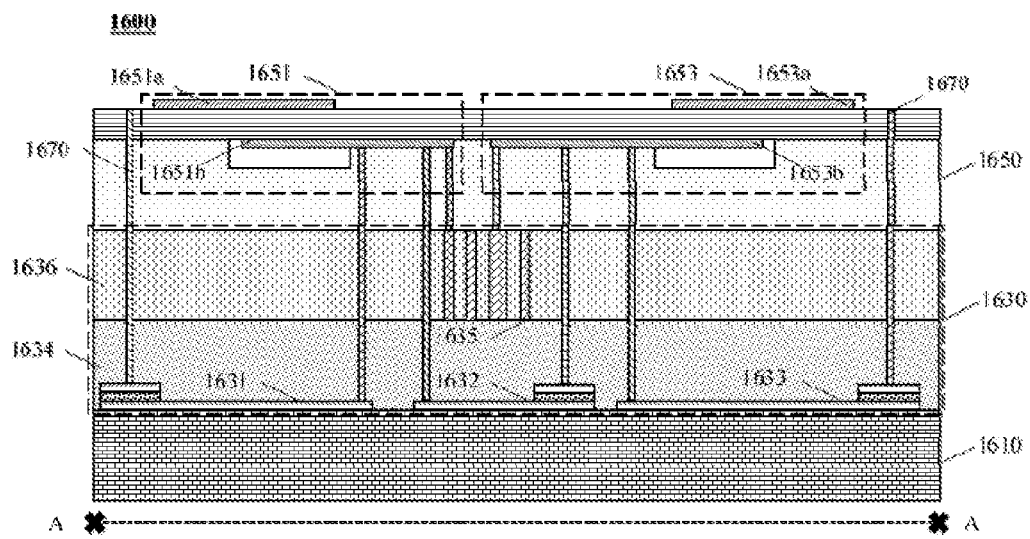
FIG. 16a is a structural diagram of cross-section A of a filter device 1600 in an embodiment of the invention.

FIG. 16*a* is a structural diagram of cross-section A of a filter device 1600 of an embodiment of the invention.

As shown in FIG. 16*a*, an embodiment of the invention provides a filter device 1600, which comprises a substrate 1610, an integrated passive device (IPD) 1630 and at least one resonance device 1650, wherein the substrate 1610 is a die substrate, the IPD 1530 is disposed over the substrate 1610, and the at least one resonance device 1650 is disposed over the IPD 1630.

In this embodiment, the substrate 1610 and the at least one resonance device 1650 are respectively located on two sides of the IPD 1630. In this embodiment, the substrate 1610, the IPD 1630 and the at least one resonance device 1650 are located in a die.

In this embodiment, the substrate 1610 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the IPD 1630 comprises a capacitor 1631, a capacitor 1632 and a capacitor 1633 which are located on the substrate 1610, an intermediate layer 1634 located on the substrate 1610 and covering the capacitor 1631, the capacitor 1632 and the capacitor 1633, an inductor 1635 located on the intermediate layer 1634, and an intermediate layer 1636 located on the intermediate layer 1634, wherein the inductor 1635 is inlaid in the intermediate layer 1636.

In this embodiment, the capacitor 1631, the capacitor 1632 and the capacitor 1633 are MIM capacitors. In this embodiment, the capacitor 1631, the capacitor 1632 and the capacitor 1633 are formed through a semiconductor process. It should be noted that the MIM capacitors in this embodiments are merely specific examples which are not intended to limit the invention, and capacitors manufactured through other semiconductor processes known by those skilled in the art, such as MOM capacitors, can also be applied to the embodiments of the invention.

In this embodiment, the intermediate layer 1634 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, the inductor 1635 is a spiral inductor. In this embodiment, the inductor 1635 is formed through a semiconductor process. It should be noted that the spiral inductor in this embodiment is merely a specific example which is not intended to limit the invention, and inductors manufactured through other semiconductor processes known by those skilled in the art can also be applied to the embodiments of the invention.

In this embodiment, the thickness of the inductor 1635 is equal to that of the intermediate layer 1636. In another embodiment, the thickness of the inductor is smaller than that of the intermediate layer.

In this embodiment, the intermediate layer 1636 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, the at least one resonance device 1650 comprises a BAW resonance device 1651 and a BAW resonance device 1653, wherein the BAW resonance device 1651 comprises a first active region (not shown), and the first active region comprises a piezoelectric layer (not shown), and an electrode layer 1651*a* and an electrode layer 1651*b* which are located on two sides of the piezoelectric layer; and the BAW resonance device 1653 comprises a second active region (not shown), and the second active region comprises a piezoelectric layer, and an electrode layer 1653*a* and an electrode layer 1653*b* which are located on two sides of the piezoelectric layer.

It should be noted that the BAM resonance devices 1651 and 1653 in this embodiment are merely specific examples which are not intended to limit the invention and other BAW resonance devices or SAW resonance devices known by those skilled in the art can also be applied to the embodiments of the invention.

In another embodiment, the filter device comprises three or more BAW or SAW resonance devices.

In this embodiment, the filter device 1600 further comprises multiple through holes 1670; the electrode layer 1651*a* is connected to an input terminal; the electrode layer 1651*b* is electrically connected to a first terminal of the capacitor 1631, a first terminal of the capacitor 1632 and a first terminal of the inductor 1635 by means of the through holes 1670; a second terminal of the capacitor 1631 is grounded by means of one through hole 1670; a second terminal of the capacitor 1632 and a second terminal of the inductor 1635 are electrically connected to the electrode layer 1653 by means of the corresponding through holes 1670; the electrode layer 1653b is electrically connected to a first terminal of the capacitor 1633 by means of one through hole 1670; a second terminal of the capacitor 1633 is grounded by means of one through hole 1670; and the electrode layer 1653a is connected to an output terminal.

Figure 16B:
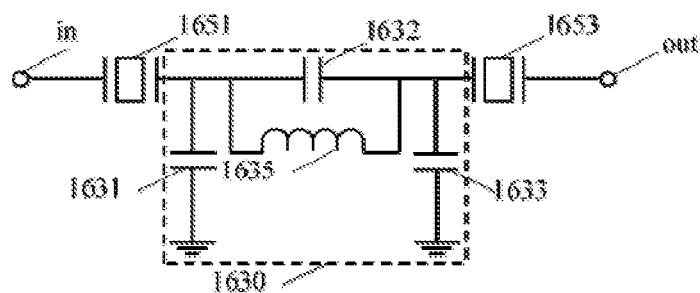
FIG. 16b is an equivalent circuit diagram of the filter device 1600 in the embodiment of the invention.

FIG. 16b is an equivalent circuit diagram of the filter device 1600 in this embodiment of the invention.

As shown in FIG. 16b, an equivalent circuit of the filter device 1600 comprises the BAW resonance device 1651, the capacitor 1631, the capacitor 1632, the inductor 1635, the capacitor 1633 and the BAW resonance device 1653, wherein a first terminal of the resonance device 1651 is connected to an input terminal in, and a second terminal of the resonance device 1651 is electrically connected to the first terminal of the capacitor 1631, the first terminal of the capacitor 1632 and the first terminal of the inductor 1635; the first terminal of the capacitor 1631 is also electrically connected to the first terminal of the capacitor 1632 and the first terminal of the inductor 1635; the second terminal of the capacitor 1631 is grounded; the first terminal of the capacitor 1632 is also connected to the first terminal of the inductor 1635; the second terminal of the capacitor 1632 is electrically connected to the second terminal of the inductor 1635, a first terminal of the BAW resonance device 1653 and the first terminal of the capacitor 1633; the second terminal of the inductor 1635 is also electrically connected to the first terminal of the BAW resonance device 1635 and the first terminal of the capacitor 1633; the first terminal of the capacitor 1633 is also electrically connected to the first terminal of the BAW resonance device 1653; the second terminal of the capacitor 1633 is grounded; and a second terminal of the BAW resonance device 1653 is connected to an output terminal out.

In this embodiment, the equivalent circuit of the IPD 1630 formed by the capacitor 1631, the capacitor 1632, the capacitor 1633 and the inductor 1635 is a band-pass filter circuit. In another embodiment, the equivalent circuit of the IPD includes, but is not limited to, at least one of a low-pass filter circuit, a high-pass filter circuit and a band-stop filter circuit.

It should be noted that the circuit in this embodiment is merely a specific example which is not intended to limit the invention, and other circuits known by those skilled in the art can also be applied to the embodiments of the invention.

It should be noted that the filter device formed by integrating the resonance device and the passive device in one die can broaden the pass-band width, has a high out-of-band rejection, and occupies less space in an RF front-end chip. In addition, compared with electrical connection of one resonance device and one passive device, the integration of the resonance device and the passive device in one die can reduce electrical transmission losses (because the electrical transmission path is shorter), thus improving the filter performance.

Figure 17:
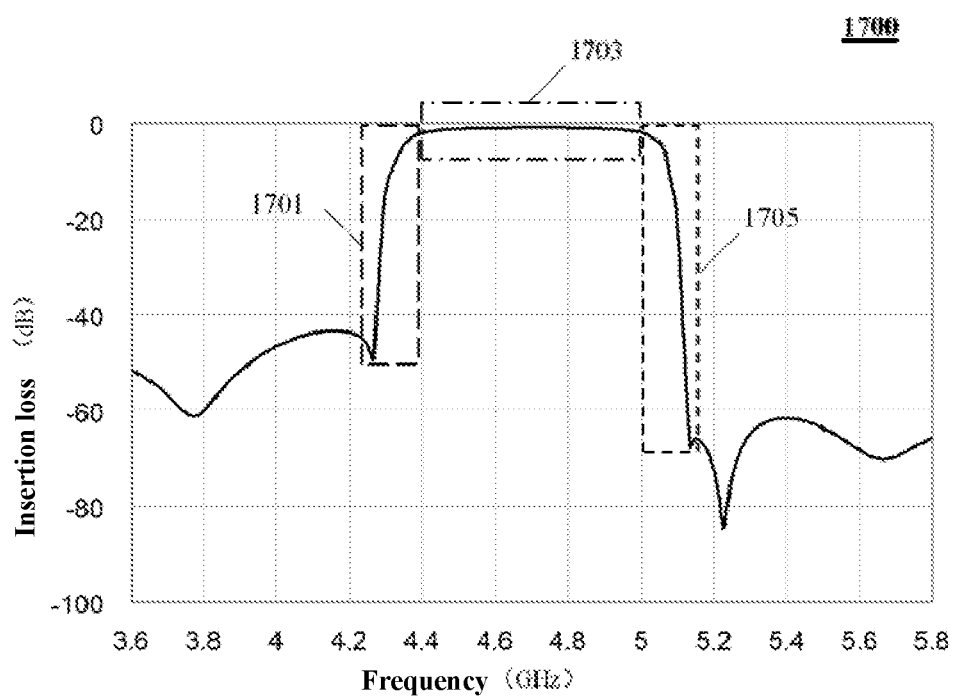
FIG. 17 is a performance diagram 1700 of a filter device in an embodiment of the invention.

FIG. 17 shows a performance diagram 1700 of a filter device in an embodiment of the invention. Obviously, the invention can also be implemented by other filter devices different from the one described herein. Hence, the invention is not limited to the specific embodiments described below.

An embodiment of the invention provides a filter device (not shown), which comprises a die substrate, a band-pass filter device (such as the IPD 1630 in FIG. 16), a first BAW resonance device (such as the BAW resonance device 1651 in FIG. 16), and a second BAW resonance device (such as the BAW resonance device 1653 in FIG. 16), wherein the first BAW resonance device and the second BAW resonance device are located on a first side of the band-pass filter device, the die substrate is located on a second side of the band-pass filter device, and the first side is opposite to the second side.

In this embodiment, the first BAW resonance device, the second BAW resonance device, the pass-band filter device and the die substrate are located in a die.

In an equivalent circuit (not shown) of the filter device, the first BAW resonance device and the second BAW resonance device are respectively located on two sides of the pass-band filter device, wherein a signal is input to a first terminal, then sequentially passes through the first BAW resonance device and the pass-band filter device, and finally passes through the second BAW resonance device, and a filtered signal is output from a second terminal.

As shown in FIG. 17, the performance diagram 1700 of the filter device includes an insertion loss curve, wherein the horizontal axis of the insertion loss curve represents frequency (unit: GHz), and the vertical axis of the insertion loss curve represents insertion loss (unit: dB). The insertion loss curve includes a first out-of-band rejection region 1701, a band-pass region 1703 and a second out-of-band rejection region 1705, wherein the first out-of-band rejection region 1701 is mainly based on the first BAW resonance device, the band-pass region 1703 is mainly based on the band-pass filter device, and the second out-of-band rejection 1705 is mainly based on the second BAW resonance device.

In this embodiment, the first out-of-band rejection region 1701 has a high out-of-band rejection, and the second out-of-band rejection region 1705 has a high out-of-band rejection.

It should be noted that the insertion loss curve and the filter device can be applied to 5G n79band (4.4 to 5 GHz).

It should be noted that the filter device formed by integrating the resonance device and the passive device in one die can broaden the pass-band width, has a high out-out-band rejection and occupied less space in an RF front-end chip.

An embodiment of the invention further provides an RF front-end device which comprises, but is not limited to, at least one first filter device provided by one of the aforementioned embodiments, and a power amplification device connected to the first filter device.

An embodiment of the invention further provides an RF front-end device which comprises, but is not limited to, at least one second filter device provided by one of the aforementioned embodiments, and a low-noise amplification device connected to the second filter device.

An embodiment of the invention further provides an RF front-end device which comprises, but is not limited to, a multiplexing device, wherein the multiplexing device comprises at least one third filter device provided by one of the aforementioned embodiments.

An embodiment of the invention further provides a wireless communication device which comprises, but is not limited to, the RF front-end device provided by one of the aforementioned embodiments, an antenna connected to a first terminal of the RF front-end device, and a baseband processing device connected to a second terminal of the RF front-end device.

To sum up, a resonance device (such as an SAW or BAW resonance device) and a passive device (such as an IPD) can be integrated in one die to form an RF filter device, which can broaden the pass-band width, has a high out-of-band rejection, and occupies less space in an RF front-end chip.

In addition, compared with electrical connection of one resonance device and one passive device, the integration of the resonance device and the passive device in one die can reduce electrical transmission losses, thus improving the filter performance.

It should be understood that the examples and embodiments in this specification are merely illustrative ones, and various modifications and amendments can be made by those skilled in the art without departing from the spirit and scope defined by this application and the appended claims.

What is claimed is:

1. A filter device, comprising:
a substrate, a passive device and at least one resonance device, wherein:
the passive device has a first side and a second side opposite to the first side, the substrate is located on the first side, and the at least one resonance device is located on the second side;
the at least one resonance device includes a first resonance device, the first resonance device comprises a first intermediate layer, the first intermediate layer has a third side and a fourth side opposite to the third side, and the passive device is located on the third side;
the first intermediate layer further has a first cavity located in the fourth side;
the first resonance device further comprises a first electrode layer, a first piezoelectric layer and a second electrode layer;
at least one terminal of the first electrode layer is located in the first cavity;
the first piezoelectric layer is located on the fourth side and disposed on the first electrode layer, is a flat layer and at least covers the first cavity;
the second electrode layer is located on the first piezoelectric layer; and
the first electrode layer and the second electrode layer are respectively located on two sides of the piezoelectric layer.

2. The filter device according to claim 1, wherein the substrate, the passive device and the at least one resonance device are located in a die.

3. An RF front-end device, comprising at least one filter device according to claim 2, and a power amplification device connected to the filter device.

4. A wireless communication device, comprising the RF front-end device according to claim 3, an antenna connected to a first terminal of the RF front-end device, and a baseband processing device connected to a second terminal of the RF front-end device.

5. An RF front-end device, comprising at least one filter device according to claim 2, and a low-noise amplification device connected to the filter device.

6. A wireless communication device, comprising the RF front-end device according to claim 5, an antenna connected to a first terminal of the RF front-end device, and a baseband processing device connected to a second terminal of the RF front-end device.

7. An RF front-end device, comprising a multiplexing device, wherein the multiplexing device comprises at least one filter device according to claim 2.

8. A wireless communication device, comprising the RF front-end device according to claim 7, an antenna connected to a first terminal of the RF front-end device, and a baseband processing device connected to a second terminal of the RF front-end device.

9. The filter device according to claim 1, wherein the passive device comprises at least one of a capacitor, an inductor, a resistor and a through hole.

10. The filter device according to claim 1, wherein the passive device includes an IPD which is formed through a semiconductor process.

11. An RF front-end device, comprising at least one filter device according to claim 10, and a power amplification device connected to the filter device.

12. A wireless communication device, comprising the RF front-end device according to claim 11, an antenna connected to a first terminal of the RF front-end device, and a baseband processing device connected to a second terminal of the RF front-end device.

13. An RF front-end device, comprising at least one filter device according to claim 10, and a low-noise amplification device connected to the filter device.

14. A wireless communication device, comprising the RF front-end device according to claim 13, an antenna connected to a first terminal of the RF front-end device, and a baseband processing device connected to a second terminal of the RF front-end device.

15. An RF front-end device, comprising a multiplexing device, wherein the multiplexing device comprises at least one filter device according to claim 10.

16. A wireless communication device, comprising the RF front-end device according to claim 15, an antenna connected to a first terminal of the RF front-end device, and a baseband processing device connected to a second terminal of the RF front-end device.

17. The filter device according to claim 1, wherein the at least one resonance device includes at least one of an SAW resonance device and a BAW resonance device.

18. The filter device according to claim 1, wherein the at least one resonance device is electrically connected to the passive device.

19. The filter device according to claim 1, wherein the first intermediate layer is made of at least one of the following materials: polymer, insulating dielectric and polysilicon.

20. The filter device according to claim 1, wherein the first resonance device further comprises a third electrode layer, a second piezoelectric layer and a fourth electrode layer, wherein the third electrode layer is located on the first cavity and covers the first cavity; the second piezoelectric layer is located on the fourth side and disposed over the first intermediate layer and at least covers the third electrode layer; the fourth electrode layer is located on the second piezoelectric layer; and the third electrode layer and the fourth electrode layer are respectively located on two sides of the second piezoelectric layer.

21. The filter device according to claim 1, wherein the at least one resonance device comprises a second resonance device, wherein the second resonance device comprises a second intermediate layer, and the second intermediate layer has a fifth side and a sixth side opposite to the fifth side, and the passive device is located on the fifth side.

22. The filter device according to claim 21, wherein the second intermediate layer is made of at least one of the following materials: polymer, insulating dielectric and polysilicon.

23. The filter device according to claim 21, wherein the second resonance device further comprises a fifth piezoelectric layer and a ninth electrode layer, wherein the fifth piezoelectric layer is located on the sixth side and is disposed on the second intermediate layer, the ninth electrode layer is located on the fifth piezoelectric layer, and the second intermediate layer and the ninth electrode layer are respectively located on two sides of the fifth piezoelectric layer.

24. The filter device according to claim 23, wherein the second resonance device further comprises a third intermediate layer, which is located on the fifth side, disposed between the passive device and the second intermediate layer and used to block leaky waves.

25. The filter device according to claim 24, wherein the second intermediate layer and the third intermediate layer are made of different materials.

26. The filter device according to claim 24, wherein the third intermediate layer is made of at least one of the following materials: polymer, insulating dielectric and polysilicon.

27. The filter device according to claim 23, wherein the second intermediate layer further comprises third sub-reflection layers and fourth sub-reflection layers, wherein the third sub-reflection layers and the fourth sub-reflection layers are arranged alternately and are made of different materials.

28. The filter device according to claim 27, wherein a thickness of the third sub-reflection layers is different from that of the fourth sub-reflection layers.

29. The filter device according to claim 23, wherein the second intermediate layer further comprises a Bragg reflector.

30. An RF front-end device, comprising at least one filter device according to claim 1, and a power amplification device connected to the filter device.

31. A wireless communication device, comprising the RF front-end device according to claim 30, an antenna connected to a first terminal of the RF front-end device, and a baseband processing device connected to a second terminal of the RF front-end device.

32. An RF front-end device, comprising at least one filter device according to claim 1, and a low-noise amplification device connected to the filter device.

33. A wireless communication device, comprising the RF front-end device according to claim 32, an antenna connected to a first terminal of the RF front-end device, and a baseband processing device connected to a second terminal of the RF front-end device.

34. An RF front-end device, comprising a multiplexing device, wherein the multiplexing device comprises at least one filter device according to claim 1.

35. A wireless communication device, comprising the RF front-end device according to claim 34, an antenna connected to a first terminal of the RF front-end device, and a baseband processing device connected to a second terminal of the RF front-end device.

* * * * *